(12) United States Patent
Shonai

(10) Patent No.: US 12,234,571 B2
(45) Date of Patent: Feb. 25, 2025

(54) SiC SINGLE CRYSTAL SUBSTRATE

(71) Applicant: Resonac Corporation, Tokyo (JP)

(72) Inventor: Tomohiro Shonai, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/326,109

(22) Filed: May 31, 2023

(65) Prior Publication Data
US 2023/0392285 A1 Dec. 7, 2023

(30) Foreign Application Priority Data

Jun. 2, 2022 (JP) ................. 2022-090472

(51) Int. Cl.
*H01L 29/16* (2006.01)
*C30B 29/06* (2006.01)
(Continued)

(52) U.S. Cl.
CPC .............. *C30B 29/06* (2013.01); *C30B 29/60* (2013.01); *C30B 33/10* (2013.01); *H01L 29/1608* (2013.01)

(58) Field of Classification Search
CPC ..... H01L 29/1608; C30B 29/06; C30B 29/60; C30B 33/10
(Continued)

(56) References Cited

U.S. PATENT DOCUMENTS

2013/0095285 A1* 4/2013 Sasaki .................. C30B 23/06
117/106
2013/0095294 A1* 4/2013 Sasaki .................. C30B 23/025
117/106

(Continued)

FOREIGN PATENT DOCUMENTS

CN 102817083 A 12/2012
CN 103590101 A 2/2014
(Continued)

OTHER PUBLICATIONS

Sandeep Mahajan, et al., "Investigation of micropipe and defects in molten KOH etching of 6H n-silicon carbide (SiC) single crystal", Material Letters, 2013, vol. 101, pp. 72-75.
(Continued)

*Primary Examiner* — Igwe U Anya
(74) *Attorney, Agent, or Firm* — Sughrue Mion, PLLC

(57) ABSTRACT

A SiC single crystal substrate of an embodiment is a SiC single crystal substrate wherein the main plane of the SiC single crystal substrate has an off angle of 0° to 6° to the (0001) plane in the <11-20> direction and an off angle of 0° to 0.5° to the (0001) plane in the <1-100> direction, and includes non-MP defects wherein when the Si surface is etched in molten KOH at 500° C. for 15 minutes, the non-MP defects that appear by etching are hexagonal and have no core, the area of the observed etch pit of the non-MP defect is more than 10% larger than that of the observed etch pit of the TSD and is less than 110% of that of the observed etch pit of the micropipe (MP), and a transmission X-ray topography image of the non-MP defect is distinguishable from the transmission X-ray topography image of the micropipe (MP), wherein etch pits, which are identified as the non-MP defects, appear in the range of $0.1/cm^2$ to $50/cm^2$.

8 Claims, 12 Drawing Sheets

(51) Int. Cl.
  *C30B 29/60* (2006.01)
  *C30B 33/10* (2006.01)
(58) Field of Classification Search
  USPC .......................................................... 257/77
  See application file for complete search history.

(56) References Cited

U.S. PATENT DOCUMENTS

2013/0280466 A1* 10/2013 Zwieback .............. B28D 5/00
                                                    428/64.1
2018/0219069 A1*  8/2018 Okamoto ............. H01L 29/045
2021/0388527 A1  12/2021 Park et al.

FOREIGN PATENT DOCUMENTS

| | | |
|---|---|---|
| CN | 103590101 B | 2/2016 |
| CN | 105734673 A | 7/2016 |
| CN | 110408988 A | 11/2019 |
| CN | 110857476 A | 3/2020 |
| CN | 113322519 A | 8/2021 |
| CN | 113322521 A | 8/2021 |
| CN | 114481307 A | 5/2022 |
| CN | 114540943 A | 5/2022 |
| JP | 2000-34199 A | 2/2000 |
| JP | 2000-44398 A | 2/2000 |
| JP | 2009-256145 A | 11/2009 |
| JP | 4585137 B2 * | 11/2010 |
| JP | 2019-189499 A | 10/2019 |
| JP | 6594146 B2 | 10/2019 |
| JP | 6598150 B2 | 10/2019 |
| JP | 2020-017627 A | 1/2020 |
| JP | 2020-128303 A | 8/2020 |
| JP | 2021-138597 A | 9/2021 |
| JP | 2021-195298 A | 12/2021 |

OTHER PUBLICATIONS

B. Kallinger, et al., "Threading dislocations in n- and p-type 4H—SiC material analyzed by etching and synchrotron X-ray topography", Journal of Crystal Growth, 2011, vol. 314, pp. 21-29.
Passapong Wutimakun, et al., "Nondestructive three-dimensional observation of defects in semi-insulating 6H—SiC single-crystal wafers using a scanning laser microscope (SLM) and infrared light-scattering tomography (IR-LST)", Journal of Crystal Growth, 2009, vol. 311, pp. 3781-3786.

* cited by examiner

SiC SINGLE CRYSTAL SUBSTRATE

Priority is claimed on Japanese Patent Application No. 2022-090472, filed on Jun. 2, 2022, the content of which is incorporated herein by reference.

BACKGROUND OF THE INVENTION

Field of the Invention

The present disclosure relates to a SiC single crystal substrate.

Description of Related Art

Silicon carbide (SiC) has a breakdown electric field larger by one digit than and the band gap three times larger than those of silicon (Si). Moreover, silicon carbide (SiC) has characteristics such as thermal conductivity being about three times higher than silicon (Si). Silicon carbide (SiC) is expected to be applied to power devices, high frequency devices, high temperature operation devices, and the like. For such SiC devices, a SiC epitaxial wafer is used recently.

SiC epitaxial wafers are obtained by laminating a SiC epitaxial layer on the surface of a SiC single crystal substrate. Hereafter, the substrate before the lamination of the SiC epitaxial layer is referred to as a SiC single crystal substrate, and the substrate after the lamination of the SiC epitaxial layer is referred to as a SiC epitaxial wafer. SiC single crystal substrates are cut from a SiC single crystal ingot.

The mainstream of the current market for SiC single crystal substrates is SiC single crystal substrates with a diameter of 6 inches (150 mm), but the development for mass production of SiC single crystal substrates with a diameter of 8 inches (200 mm) is progressing, and full-scale mass production is beginning. Increasing production efficiency and reducing costs by increasing the diameter from 6 inch to 8 inch is expected to further popularize SiC power devices as the most effective means in energy-saving technologies.

In manufacturing the next generation of large-diameter SiC single crystal substrates, the same quality cannot be obtained by applying the manufacturing conditions optimized for the manufacture of SiC single crystal substrates with current size. This is because new problems arise with each new size. For example, Patent Literature 1 describes a problem that when a manufacturing technique of a 4-inch SiC single crystal substrate is applied to the manufacture of a 6-inch SiC single crystal substrate, thermal decomposition frequently occurs around the outer peripheral portion of the seed crystal, which causes macro defects, and therefore, single crystals with high crystal quality are not obtained with good yield. Patent Literature 1 describes an invention that solves the problem by using seed crystals of a given thickness. In this way, it is necessary to establish the manufacturing conditions for SiC single crystal substrates with new sizes while solving new problems that have arisen in response to new sizes.

CITATION LIST

Patent Literature

Patent Literature 1: Japanese Examined Patent. No. 6594146
Patent Literature 2: Japanese Examined Patent, No. 6598150
Patent Literature 3: Japanese Unexamined Patent Application, First Publication No. 2020-17627
Patent Literature 4: Japanese Unexamined Patent Application, First Publication No. 2019-189499

The SiC single crystal substrate is obtained through the SiC single crystal ingot fabrication process and the SiC single crystal substrate fabrication process to fabricate the SiC single crystal substrate from the SiC single crystal ingot. To establish manufacturing technology for 8-inch SiC single crystal substrates, it is necessary to solve new problems specific to 8-inch substrates in each of the SiC single crystal ingot fabrication process and the SiC single crystal substrate fabrication process.

New problems specific to 8-inch substrates include, for example, obtaining an 8-inch substrate with the same dislocation density as that of a 6-inch substrate in the SiC single-crystal ingot fabrication process. When an 8-inch substrate is manufactured simply by applying a SiC single crystal substrate fabrication technique optimized for the manufacture of 6-inch substrates, an 8-inch substrate with a dislocation density higher than that of a 6-inch substrate is produced. The larger the size, the greater the hurdle to get the same quality. Therefore, when evaluating the technical significance of the manufacturing technique of 8-inch SiC single crystal substrates, the dislocation density of 8-inch substrates obtained by simply applying the manufacturing technique of SiC single crystal substrates optimized for the manufacture of 6-inch substrates is the starting point, and the technical significance should be evaluated by how much the dislocation density of the starting point has been improved on the basis of the dislocation density of the starting point.

On the other hand, the yield of 8-inch SiC single crystal substrates in mass production is determined by the same or more stringent evaluation criteria as 6-inch SiC single crystal substrates. Each step of improvement leads to the establishment of manufacturing technology for 8-inch SiC single crystal substrates.

As a result of diligent study, the inventor discovered a new type of defect that has not been reported before in SiC single crystal substrates, and found that the change in SORI before and after the ion implantation was small when the new type of defects were present at a given range of the density thereof.

The present disclosure has been made in view of the above circumstances, and aims to provide a SiC single-crystal substrate with a small change in SORI before and after ion implantation.

SUMMARY OF THE INVENTION

The present disclosure provides the following means to solve the above problems.

An aspect of the present disclosure provides a SiC single crystal substrate, wherein the main plane of the SiC single crystal substrate has an off angle of 0 to 6° to the (0001) plane in the <11-20> direction and an off angle of 0° to 0.5° to the (0001) plane in the <1-100> direction, and includes non-MP defects wherein when the Si surface is etched in molten KOH at 500° C. for 15 minutes, the non-MP defects that appear by etching are hexagonal and have no core, the area of the observed etch pit of the non-MP defect is more than 10% larger than that of the observed etch pit of the TSD and is less than 110% of that of the observed etch pit of the micropipe (MP), and a transmission X-ray topography image of the non-MP defect is distinguishable from the transmission X-ray topography image of the micropipe (MP), wherein etch pits, which are identified as the non-MP defects, appear in the range of 0.1/cm² to 50/cm².

In the SiC single crystal substrate according to the above aspect, etch pits, which are identified as the non-MP defects, may appear in the range of 0.9/cm² to 50/cm².

In the SiC single crystal substrate according to the above aspect, when the substrate is divided into a central region within the range of r/2 (where r is the radius of the substrate) from the center of the substrate and an outer region located outside the central region, the density of non-MP defect pits (NA/cm²) in the central region and the density of non-MP defect pits (NB/cm²) in the outer region may satisfy the following relationship:

$$0.01 < NP < 0.5 \text{ (where } NP = \{NA/(NA+NB)\})$$

In the SiC single crystal substrate according to the above aspect, the diameter of the SiC single crystal substrate may be in a range of 145 mm to 155 mm.

In the SiC single crystal substrate according to the above aspect, the diameter of the SiC single crystal substrate may be in a range of 190 mm to 205 mm.

An another aspect of the present disclosure provides a SiC single crystal substrate, wherein the main plane of the SiC single crystal substrate has an off angle of 0° to 6° to the (0001) plane in the <11-20> direction and an off angle of 0° to 0.5° to the (0001) plane in the <1-100> direction, and includes non-MP defects wherein when the Si surface is etched in molten KOH at 500° C. for 15 minutes, the non-MP defects that appear by etching are hexagonal and have no core, the area of the observed etch pit of the non-MP defect is more than 10% larger than that of the observed etch pit of the TSD and is less than 110% of that of the observed etch pit of the micropipe (MP), and a transmission X-ray topography image of the non-MP defect is distinguishable from the transmission X-ray topography image of the micropipe (MP), wherein etch pits, which are identified as the non-MP defects, appear in the range of 0.01/cm² to 50/cm², and wherein when the substrate is divided into a central region within the range of r/2 (where r is the radius of the substrate) from the center of the substrate and an outer region located outside the central region, the density of non-MP defect pits (NA/cm²) in the central region and the density of non-MP defect pits (NB/cm²) in the outer region satisfy the following relationship:

$$0.01 < NP < 0.5 \text{ (where } NP = \{NA/(NA+NB)\})$$

The SiC single crystal substrate of the present disclosure can provide a SiC single crystal substrate with a small change in SORI before and after ion implantation.

DETAILED DESCRIPTION OF THE INVENTION

Hereinafter, this embodiment will be described in detail with reference to the drawings. The drawings used in the following description may show, for convenience's sake, the features of the present disclosure in enlarged form, and the dimensional proportions of the components may be different from those in practice. The materials, dimensions, and the like exemplified in the following description are only examples, and the present disclosure is not limited thereto, and the disclosure can be carried out by appropriately changing the gist thereof without changing it. In addition, in each figure, components known to those skilled in the art other than those described in the figure may be omitted.

In the crystallographic description in the present specification, the individual orientation is denoted by [ ], the assembly orientation by < >, the individual plane by ( ) and the assembly plane by { }. For a negative index, a "−" (bar)

is supposed to be placed above the number crystallographically, but in the present specification, the negative sign is placed before the number.

SiC Single Crystal Substrate

Figure 1:
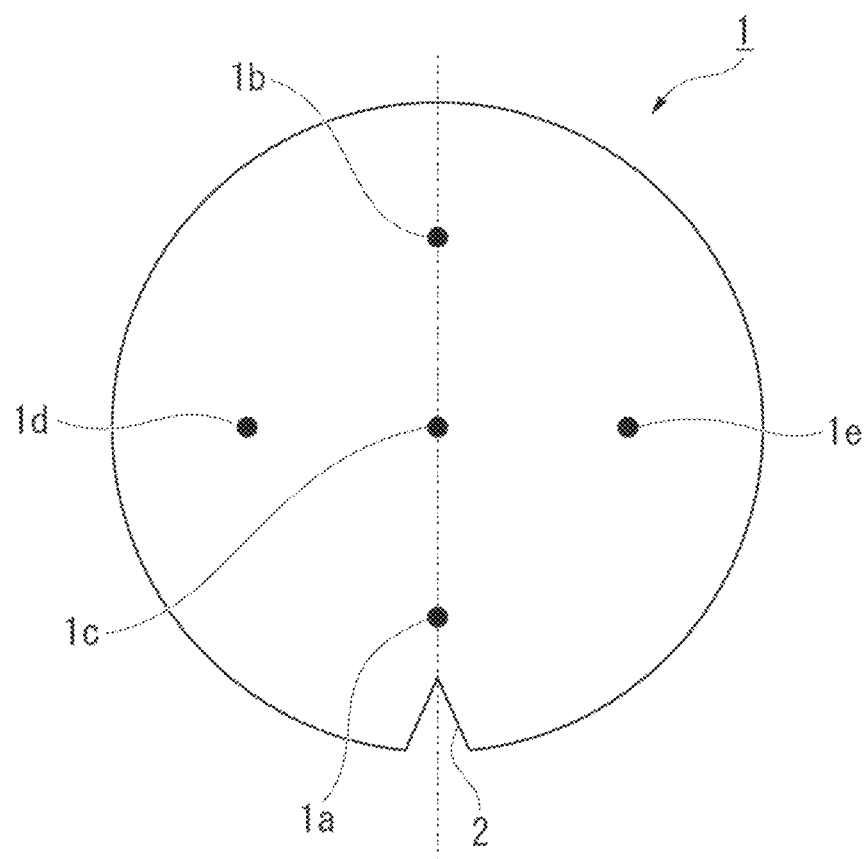
FIG. 1 is a schematic plan view of a SiC single crystal substrate according to the present embodiment.
Figure 2A:
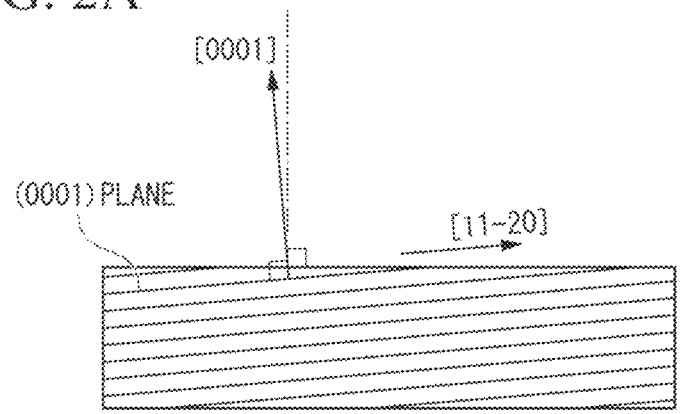
FIG. 2A is a schematic cross-sectional view cut perpendicular to the main surface of the SiC substrate.
Figure 2B:
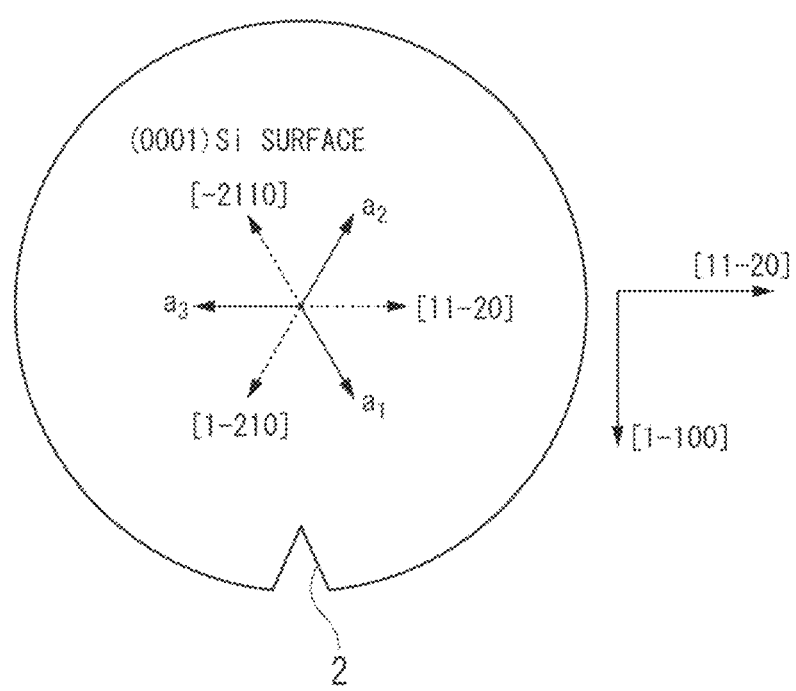
FIG. 2B is a schematic plan view from the direction perpendicular to the main surface of the SiC substrate.

FIG. 1 is a schematic plan view of a SiC single crystal substrate according to this embodiment. FIG. 2 is a schematic view showing the plane orientation of the SiC single crystal substrate. FIG. 2A is a vertical cross section cut perpendicular to the main plane, and FIG. 2B is a plan view from the direction perpendicular to the main plane.

The SiC single crystal substrate shown in FIG. 1 has a main plane of the SiC single crystal substrate has an off angle of 0° to 6° to the (0001) plane in the <11-20> direction and an off angle of 0° to 0.5° to the (0001) plane in the <1-100> direction, and includes non-MP defects wherein when the Si surface is etched in molten KOH at 500° C. for 15 minutes, the non-MP defects that appear by etching are hexagonal and have no core, the area of the observed etch pit of the non-MI defect is more than 10% larger than that of the observed etch pit of the TSD and is less than 110% of that of the observed etch pit of the micropipe (MP), and a transmission X-ray topography image of the non-MP defect is distinguishable from the transmission X-ray topography image of the micropipe (MP).

The inclusion of such non-MP defects in the SiC single-crystal substrate suppresses the change in SORI before and after the ion implantation in the device fabrication process, thereby improving the yield. This is presumed be due to the fact that the inclusion of non-MP defects leads to stress relaxation and reduces ion implantation damage.

Although there are no particular restrictions on the outer shape of the SiC single crystal substrate 1, substrates with various flat shapes and various thicknesses can be used, but the substrate is typically disk-shaped. The thickness of the SiC single crystal substrate can be in a range of, for example, 300 μm to 650 μm.

The size of the SiC single crystal substrate 1 is not limited as long as non-MP defects appear, but can be, for example, 6 inches (in a range of 145 mm to 155 mm in diameter) or 8 inches (in a range of 190 mm to 205 mm in diameter).

The SiC single crystal substrate 1 is preferably 4H—SiC, because SiC comes in a variety of polytypes, but 4H—SiC is mainly used to make practical SiC devices.

The SiC single-crystal substrate 1 has an off angle of 0° to 6° in the <11-20> direction and off angle of 0° to 0.5° in the <1-100> direction with respect to the (0001) plane.

Since the larger the off angle, the smaller the number of wafers obtained from the SiC single crystal ingot, the smaller the off angle is preferable from the viewpoint of cost reduction.

The term "non-MP defect" as used herein means a defect that has features in common with a micropipe (MP) in the etch pits that manifest in molten KOH etching but can be distinguished from the micropipe by transmission X-ray topography. Specifically, the hexagonal shape of the etch pit of the non-MP defect, which am produced by molten KOH etching at 500° C. for 15 minutes to the Si surface, is common to MP and TSD (see FIG. 3). A core is found in the center of the pit of the TSD, whereas no core is found in the pits of MP and non-MP defects (see FIG. 3). It is thought to be caused by the lack of focus on the microscope due to its large depth. The area of the observed etch pit area of the non-MP defect is more than 10% larger than that of the observed etch pit of the TSD. The area of the observed etch pit area of the non-MP defect is less than 110% of that of the observed etch pit of the MP. Also, micropipes (MP) can be detected by transmission X-ray topography, but the non-MP defects are not detected by transmission X-ray topography or the X-ray topography images of the non-MP defects are very weak in shade compared to those of micropipes.

Here, the "etch pit area" or the "area of etch pit" of each defect can be measured based on a microscopic image of the surface of the substrate where the etch pits are exposed by molten KOH etching taken by an optical microscope, etc. For example, a microscopic image can be captured in a computer, and the "etch pit area" or the "area of etch pit" is calculated using image analysis software, or measured by commercially available wafer defect analysis apparatus. The "etch pit area" or the "area of etch pit" is calculated by averaging the areas per etch pits observed in a range of 1.2×1.4 mm square at 5 points or more including the in-plane center, in the radial direction, on the surface of the substrate where the etch pits are displayed. In the same way, the number and density of etch pits of each defect can be measured based on microscopic images taken by an optical microscope or the like.

Molten KOH etching is a type of defect-selective etching that corrodes the crystal surface and selectively forms surface depressions (etch pits) that occur around crystal defects. Etch pits due to corrosion are selectively etched where the chemical potential of the crystal surface is relatively high. Therefore, the shape of the etch pit is determined by the type of dislocation defect, the direction of the dislocation line, and the symmetry of the crystal, and the type of defect can be determined from the shape.

The micropipes are hollow-through defects with diameters in a range of a few μm to tens of μm that penetrate the crystal in the growth direction (c-axis direction), and it is thought that the cause of these defects is strain relaxation of the threading screw dislocation. That is, threading screw dislocation are relaxed during crystal growth with the occurrence of the micropipes, which result in the formation of hollow-through defects with a hollow-core and the micropipes are considered to be a type of dislocation.

The type of dislocation (including micropipe) can be determined by using an optical microscope, an electron microscope (SEM), etc., from the shape of the etch pits revealed by the molten KOH etching. In general, an etch pit with a large hexagonal shape and no core corresponds to a micropipe (MP), an etch pit with a medium hexagonal shape and a core corresponds to a threading screw dislocation (TSD), an etch pit with a small hexagonal shape and a core corresponds to a threading edge dislocation (TED), and an etch pit with an elliptical shape (shell shape) corresponds to a basal plane dislocation (BPD). Because the BPD extends in the c-plane, the BPD etch pits have a shell-like shape that extends toward the off-orientation of the substrate, and the TSD and TED etch pits are formed by preferentially etching where the bond is weak (dislocation core).

The micropipe (MP) etch pits (The term "MP etch pit" is used below.), the threading screw dislocation (TSD) etch pits (The term "TSD etch pit" is used below.) and the threading edge dislocation (TED) etch pits (The term "TED etch-pit" is used below.) share a common hexagonal shape, but the TSD etch pits and TED etch pits differ from the MP etch pits in having a core and its size.

When the hexagonal etch pit is taken as a circle with the diameter of the longest diagonal of the anisotropic hexagonal of the etch pit, the size of the MIP etch pit is about 5 μm to 50 μm, the size of the TSD etch pit is about 1 μm to 10 μm, and the size of the TED etch pit is about 1 μm to 10 μm.

Figure 3A:
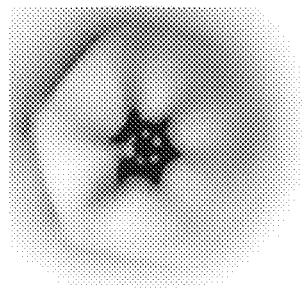
FIG. 3A is an optical microscope image of an etch pit on a SiC single crystal substrate, corresponding to a non-MP defect.
Figure 3B:
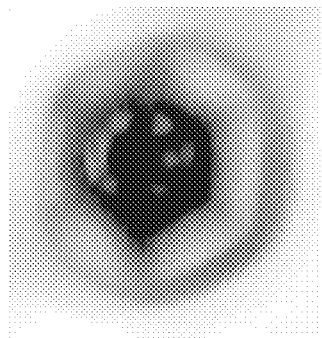
FIG. 3B is an optical microscope image of an etch pit on a SiC single crystal substrate, corresponding to a micropipe.
Figure 3C:
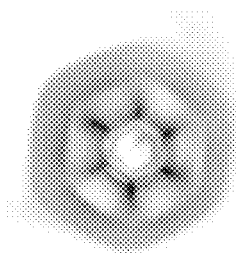
FIG. 3C is an optical microscope image of an etch pit on a SiC single crystal substrate, corresponding to a TSD.

FIG. 3 shows typical optical microscope images of each etch pit after 15 minutes of molten KOH etching at 500° C. FIG. 3A is an etch pit corresponding to a non-MP defect (The term "non-MP etch pit" is used below.), FIG. 3B is a MP etch pit, and FIG. 3C is a TSD etch pit. It can be seen that the non-MP etch pit shown in FIG. 3A has a hexagonal shape and has no core. In addition, it can be seen that the MP etch pit shown in FIG. 38 also has a hexagonal shape and has no core, which is common to the non-MP etch pits. On the other hand, the TSD etch pit shown in FIG. 3C also has a hexagonal shape, but it differs from the non-MP etch pit in having a core.

The area of the non-MP etch pit ($S_{nMP}$) was more than 10% larger than that of the TSD etch pit ($S_{TSD}$) in the same sample plane (i.e., $\{(S_{nMP}-S_{TSD})/S_{TSD})\}\times 100\geq 10$), and The area of the non-MP etch pit ($S_{nMP}$) was less than 110% of that of the MP etch pit ($S_{MP}$) (i.e., $(S_{nMP}/S_{MP})\times 100\leq 110$).

In the SiC single crystal substrate 1, the density of non-MP etch pits appearing after 15 minutes of molten KOH etching at 500° C. to the Si surface is preferably in the range of 0.01 pits/cm$^2$ to 50 pits/cm$^2$. That is, the non-MP density in the SiC single crystal substrate 1 is preferably in the range of 0.01/cm$^2$ to 50/cm$^2$.

The non-MP density in the SiC single crystal substrate 1 is more preferably in the range of 0.1/cm$^2$ to 20/cm$^2$.

The non-MP density in the SiC single crystal substrate 1 is much more preferably in the range of 1/cm$^2$ to 10/cm$^2$.

X-ray topography (XRT) takes advantage of the fact that when there is an imperfect region (crystal defect) of disordered lattice in the crystal in X-ray diffraction, the diffraction X-ray intensity increases near the imperfect region. X-ray topography images are two-dimensional images obtained by converting the intensity of diffracted X-rays into shades (contrast) by irradiating a sample with X-rays under Bragg condition. Around the crystal defect, the diffraction X-ray intensity increases due to the distortion of the crystal lattice, and the color density becomes darker on the XRT image. From this pattern of shading, information on the shape and distribution of defects can be obtained. In contrast to reflection X-ray topography, which can provide information of defects on the surface layer with a thickness of several Vim to 20 μm, transmission X-ray topography can provide information of defects on the entire thickness of the sample substrate.

Figure 4A:
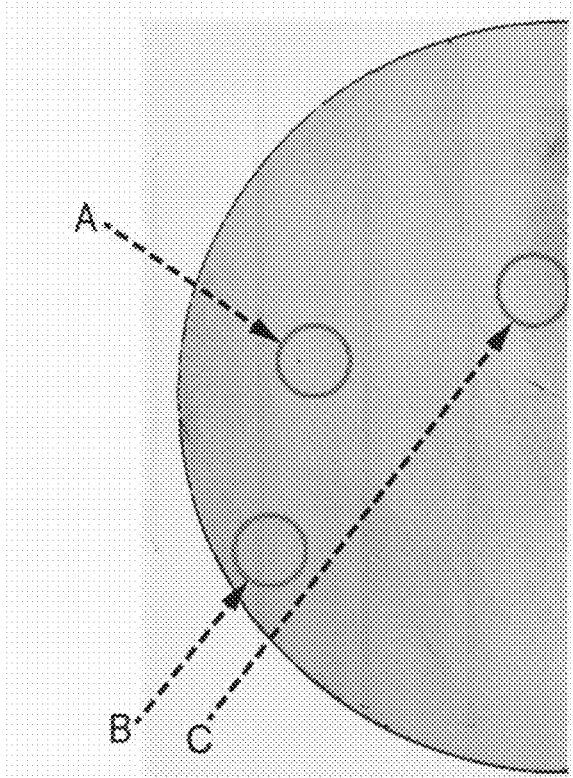
FIG. 4A is a transmission X-ray topographic image of a SiC single crystal substrate.
Figure 4B:
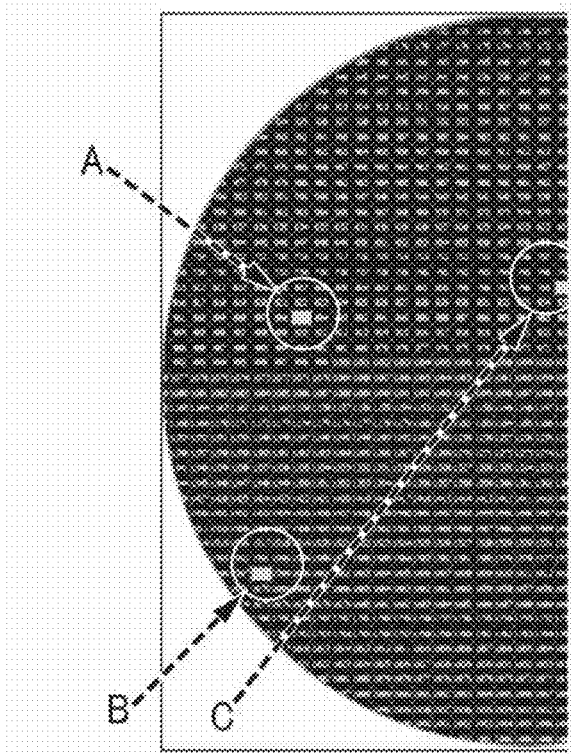
FIG. 4B is an optical microscope image of the surface where etch pits were exposed by molten KOH etching.

FIG. 4A shows a transmission X-ray topography image (g(1-100)) of a SiC single crystal substrate according to the present embodiment. FIG. 4B shows an optical microscope image of the surface where etch pits were exposed by molten KOH etching at 500° C. for 15 minutes after transmission X-ray topography images were obtained for the same SiC single crystal substrate. The points indicated by arrows A to C in FIG. 4A correspond to the points indicated by arrows A to C in FIG. 4B, respectively.

In the transmission X-ray topography image in FIG. 4A, arrow A indicates the XRT image of the micropipe (MP), and arrows B and C indicate the XRT images of the non-MP defects. The XRT image of the micropipe and the XRT image of the non-MP defect were clearly different in shading, and the XRT images of the non-MP defects had almost no shading, and its presence could be detected by contrast with the optical microscope image of the etch pit in FIG. 4B.

It is thought that because the lattice plane is distorted around the crystal defect, even X-rays of wavelengths that did not diffract in the perfect crystal region satisfy the diffraction condition, which increases the diffraction X-ray intensity, and the XRT image of the micropipe is darker compared to the perfect crystal region. On the other hand, the fact that the XRT image of the non-MP defect has a lower intensity (weak diffraction X-ray intensity) or little intensity (little diffraction X-ray intensity) compared to the XRT image of the micropipe indicates that the non-MP defect has a different structure from the micropipe. Although further studies are needed on how the structures differ, we completed the disclosure by finding that the presence of this non-MP defect can have a favorable effect on subsequent device fabrication processes.

Newly discovered "non-MP defects" are similar to micropipes in that their etch pits are hexagonal in shape and lack a core, and many of them are similar in size, so it is difficult to find them only by optical microscopy of the etch pits. In addition. "non-MP defects" have almost no contrast as an XRT image, so it is difficult to find them only by transmission X-ray topography image observation. Furthermore, even if research and development had been carried out using both optical microscopy and transmission X-ray topography imaging of etch pits, it would have been difficult to find the existence of "non-MP defects" because the existence of such defects was not known in the first place. This discovery was made by chance when the inventor was carefully examining the manufacturing process of a 6-inch SiC single crystal substrate one by one while researching and developing a high-quality 8-inch SiC single crystal substrate. As shown in the examples, this "non-MP defect" is not unique to 8-inch SiC single-crystal substrates, but is also found on 6-inch SiC single-crystal substrates.

Figure 5:
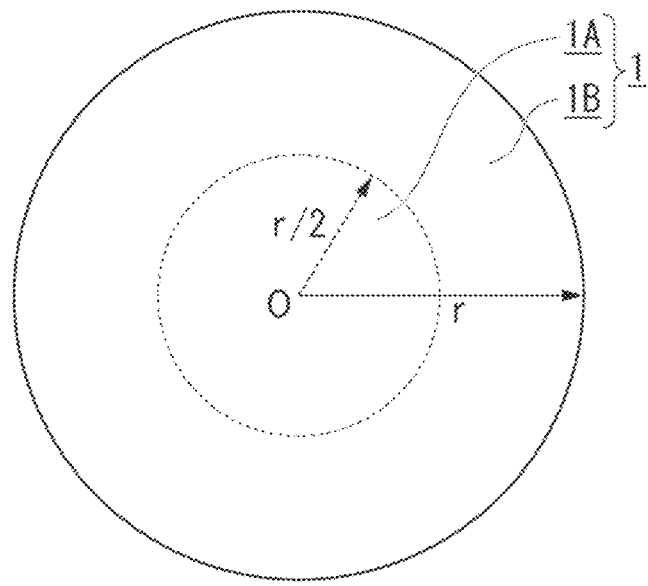
FIG. 5 is schematic plan view of a SiC single crystal substrate according to the present embodiment.

FIG. 5 is a schematic plan view of a SiC single crystal substrate according to the present embodiment, showing the case where the density distribution of non-MP etch pits differs between the central region of the SiC single crystal substrate and the outer region located around it.

Regarding the SiC single crystal substrate of the present embodiment, it is preferable that when the substrate 1 is divided into a central region 1A within the range of r/2 (where r is the radius of the substrate) from the center of the substrate and an outer region 1B located outside the central region 1A, the density of non-MP defect pits (NA/cm$^2$) in the central region 1A and the density of non-MP defect pits (NB/cm$^2$) in the outer region 1B satisfy the following relationship:

$$NP<0.5 (\text{where } NP=\{NA/(NA+NB)\})$$

That is, the density of non-MP etch pits is preferably higher in the outer region 1B than that in the central region 1A.

The higher density of non-MP etch pits in the outer region 1B than that in the central region 1A provides sufficient stress relief and moderate damage reduction from ion implantation.

It is preferable that $0.01<NP<0.5$.

When the NP is in this range, the stress relaxation effect and the damage reduction effect due to ion implantation are large, and as a result, the change in SORI before and after ion implantation in the device fabrication process is sufficiently suppressed to improve the yield.

It is more preferable that $0.05<NP<0.5$.

It is more preferable that $0.1<NP<0.4$, compared to the above case.

It is more preferable that $0.1<NP<0.3$, compared to the above case.

It is more preferable that $0.15<NP<0.25$, compared to the above case.

The density distribution of non-MP etch pits in the central region 1A and the outer region 1B located around it in the SiC single crystal substrate 1 can be adjusted by, for example, annealing conditions. The case of adjusting by annealing conditions will be described later.

It is preferable that the SiC single crystal substrate 1 has a thickness of a work-affected layer on both the front and back sides is 0.1 nm or less The main surface (hereinafter, this surface may be referred to as the 'front surface') of the SiC single crystal substrate 1 is a mirror surface. This is because that it is necessary to form an epitaxial layer on the front surface of the SiC single crystal substrate by the epitaxial growth of SiC single crystal in order to fabricate various SiC devices. The mirror surface of the front surface is formed by mirror-finishing the surface of the cut substrate, which is obtained by cutting a part to be substrate from a SiC single crystal ingot manufactured using sublimation method or the like.

The other surface (hereafter, this surface may be referred to as the 'back surface'.) need not be a mirror surface, but in the case of a SiC single crystal substrate whose front surface is a mirror surface and whose back surface is not, a difference in residual stress occurs between the front surface and the back surface, and the substrate is warped to compensate for the residual stress (Twyman effect). By making the back surface also mirror surface, the warp of the substrate caused by the Twyman effect can be suppressed. A method has been developed to fabricate a SiC single crystal substrate with low warp, whose front surface is mirror-finished and whose back surface is not mirror-finished (see, e.g., Patent Literature 2.).

The SiC single crystal substrate 1 has a notch 2, which is an index of the crystal orientation, but may have OF (Orifra, Orientation Flat) instead of notch 2.

SORI is one of the parameters that indicates the degree of warp of the substrate, and is expressed as the sum of the normal distances from the least square plane calculated by the least-squares method using all the data on the surface of the substrate to the highest and lowest points on the surface of the substrate when measured to support the back surface of the substrate without changing the original shape of the substrate.

<Relationship Between Work-Affected Layer and SORI>

The SiC single crystal substrate is prepared by slicing SiC single-crystal ingot and flattening the surfaces. Such mechanical processing introduces distortion due to the mechanical processing into the surface of the substrate. The layer where the processing distortion occurs on the surface of a SiC single crystal substrate is called a work-affected (work-altered) layer as described above. When a work-affected layer is formed on the front and back surfaces, the difference in the processing distortion occurs on the front and back surfaces, and the difference also occurs in the residual stress, causing the warp of the substrate by the Twyman effect. The shape or the warp of the substrate is determined by the balance of stress conditions generated by the work-affected layers on both sides of the substrate.

FIG. 14 of Patent Literature 3 shows the relationship between the depth of the work-affected layer of a single-crystal SiC wafer and SORI. The graph shows that the deeper the work-affected layer, the larger the SORI value. Also, when comparing a 6-inch SiC single crystal substrate with a 4-inch SiC single crystal substrate, the 6-inch SiC single crystal substrate was more susceptible to the work-affected layer than the 4-inch SiC single crystal substrate, resulting in a larger SORI. Therefore, when comparing an 8-inch SiC single crystal substrate with a 6-inch SiC single crystal substrate, it is inferred that the 8-inch SiC single crystal substrate is more susceptible to the effect of the work-affected layer, resulting in a larger SORI. Therefore, it is more important to remove the work-affected layer to reduce the warp for the 8-inch SiC single crystal substrate than for the 6-inch SiC single crystal substrate.

Method of Manufacturing SiC Single Crystal Substrate

The manufacturing method of SiC single crystal substrate according to the present embodiment, especially the manufacturing method of SiC single crystal substrate with 8-inch diameter, is explained separately for the fabrication process of SiC single crystal ingot and the fabrication process of SiC single crystal substrate from ingot.

In order to adjust the amount and the distribution of non-MP defects in SiC single crystal ingots, one or more of the following processes (i) to (iii) is performed: (i) the SiC single crystal ingots are grown and cooled under specified conditions, (ii) the SiC single crystal ingots are grown and annealed under specified conditions, and (iii) the SiC single crystal ingots are sliced and annealed under specified conditions.

<Fabrication Process of SiC Single Crystal Ingots>

Continuing intense research, the inventor found that more precise control of temperature gradients in the radial and vertical directions (crystal growth direction) for a SiC single crystal ingot with 6-inch diameter was a key point in the fabrication of a SiC single crystal ingot with 8-inch diameter. It was found that more precise control of the temperature gradient in the radial and vertical directions (crystal growth direction) could be realize d by applying the method disclosed in Patent Literature 4. Specifically, a SiC single crystal manufacturing apparatus with a heat-insulating member that can move along the extending direction of the guide member outside the guide member that guides crystal growth can be used. It is not limited to the method disclosed in Patent Literature 4 as a method for more precise control of temperature gradients in the radial and vertical directions (crystal growth direction).

In the transition to the large diameter SiC single crystal ingot, the application of the fabrication method of SiC single crystal ingots with conventional diameter does not yield large diameter SiC single crystal ingots with similar crystal quality. For example, the following problems occurred during the transition from a 4-inch diameter SiC single crystal ingot to a 6-inch diameter SiC single-crystal ingot (see Patent Literature 1).

In the growth of SiC single crystals by the sublimation recrystallization method using a seed crystal, it is necessary to make the surface shape of the ingot during growth to be nearly convex in the growth direction as one of the growth conditions to realize high crystal quality. This is because, for example, in the case of 4H-type SiC single crystals used in power devices, when growing roughly parallel to the <0001> axis, i.e., the c-axis direction of the crystal, the SiC single crystal grows by the evolution of spiral steps extruded from the threading screw dislocations. Therefore, it is said that by being generally convex, there is essentially a single step supply source on the growth surface to being able to improve the polytype stability. If the growth surface has a concave surface or multiple convex parts, there will be multiple sources supplying growth steps and steps delivered from different sources will collide. In such a case, not only defects such as dislocations are generated from the parts where they collide, but also the state of atomic stacking in the c-axis direction, which is unique to the 4H-type polytypes, becomes easily disturbed, so that different kinds of polytypes with different stacking structures, such as the 6H-type and the 15R-type, are generated and micropipe defects are generated.

Therefore, for example, in order to stabilize a 4H-type polytype suitable for power devices and grow a so-called single polytype crystal composed of only 4H-type polytypes, it is important to make the growth surface shape of the grown crystal roughly convex. Specifically, the convex shape of the grown crystal is realized by optimizing the temperature at the center of the grown crystal in terms of the growth rate, etc., and by controlling the temperature distribution during growth, that is, the shape of the isotherm, so that it becomes roughly convex. It was thought that SiC single-crystal ingots grown under such growth conditions where the roughly convex isotherm was realized would grow to be approximately parallel to the isotherm, thereby ensuring the above polytype stability.

However, when the diameter of a growing crystal is more than 150 mm (6 inches), if the temperature at the center of the growing crystal is optimized to be equivalent to that of a conventional single crystal growth of 100 mm (4 inches) in terms of growth rate, etc., while controlling the temperature gradient during growth so that the growth surface shape of the growing crystal is roughly convex in the growth direction, the temperature around the seed crystal inevitably becomes higher than that in the case of small diameter crystal growth. As a result, there was a problem that the SiC single crystal of the seed crystal itself was easily pyrolyzed at the periphery on the outer side. For this problem, Patent Literature 1 solved the problem by using a seed crystal composed of a silicon carbide single crystal with a thickness of 2.0 mm or more as the main solution.

In the present disclosure, in order to fabricate an 8-inch-diameter SiC single-crystal ingot, we have succeeded in fabricating an 8-inch-diameter SiC single-crystal ingot with characteristics comparable to those of a 6-inch-diameter SiC single-crystal ingot by controlling not only the temperature gradient in the radial direction but also the temperature gradient in the vertical direction (the crystal growth direction) using a heat-insulating member that can move the outside of the guide member to guide the crystal growth along the extending direction of the guide member, as is not the typical method for fabricating a 6-inch-diameter SiC single-crystal ingot as shown in Patent Literature 1. A SiC single crystal manufacturing apparatus and the fabrication of SiC single crystal ingots are described below.

Figure 8:
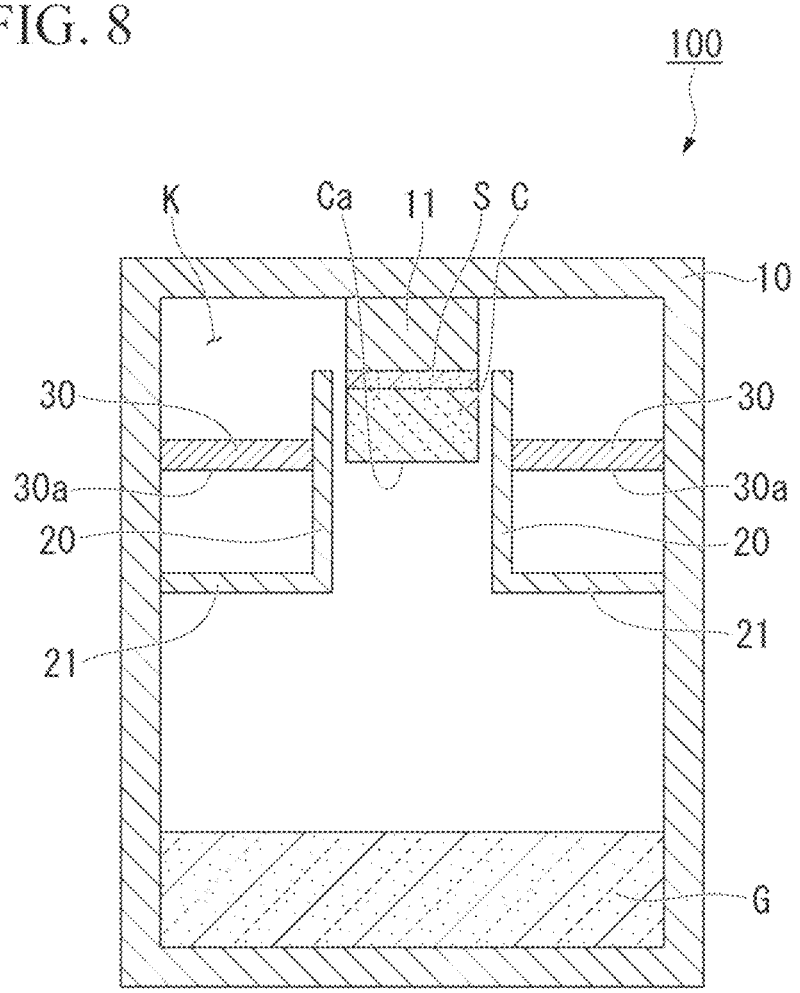
FIG. 8 is a schematic cross-sectional view of a SiC single crystal manufacturing apparatus.

FIG. 8 is a cross sectional schematic of an example of a SiC single crystal manufacturing apparatus for carrying out the fabrication process of SiC single crystal ingots.

The SiC single crystal manufacturing apparatus 100 shown in FIG. 8 is equipped with a crucible 10, a seed crystal installation part 11, a guide member 20, and a heat-insulating member 30. In FIG. 8, for ease of understanding, the source G, seed S and single crystal C grown on seed S are shown simultaneously.

As shown in the drawings, a direction in which the seed crystal installation part 11 and the raw material G face each other is defined as a vertical direction, and a direction perpendicular to the vertical direction is defined as a left-and-right direction.

The crucible 10 surrounds a film formation space K in which the single crystal C grows. A well-known crucible may serve as the crucible 10 as long as it is a crucible which can produce the single crystal C by a sublimation method. For example, a crucible made of graphite, tantalum carbide or the like can be employed. The crucible 10 is hot during growth, which is necessarily formed of a material tolerable to high temperature. For example, graphite has a very high sublimation temperature of 3550° C., and thus is tolerable to the high temperature during growth.

The seed crystal installation part 11 is provided at a position facing the raw material G in the crucible 10. A raw material gas can be efficiently supplied to the seed crystal S and the single crystal C since the seed crystal installation part 11 is located at a position facing the raw material G.

The guide member 20 extends from a periphery of the seed crystal installation part 11 toward the raw material G. That is, the guide member 20 is disposed along a crystal growth direction of the single crystal C. Consequently, the guide member 20 serves as a guide when the single crystal C crystal-grows from the seed crystal S. Crystal growth is carried out on an inner side, that is, on an inner surface side of the guide member 20.

A lower end of the guide member 20 is supported by a support 21. The support 21 closes a space between the lower end of the guide member 20 and the crucible 10 to suppress entry of the raw material gas into a region outside the guide member 20. If the raw material gas intrudes into the region, polycrystals grow between the guide member 20 and the heat-insulating member 30, and the free movement of the heat-insulating member 30 is inhibited.

A connection between the guide member 20 and the support 21 is preferably a caulking structure. The caulking structure is a structure designed to tighten the connection between the guide member 20 and the support 21 in case where physical force is applied to the guide member 20. For example, a screw structure in which the connection is threaded is an example of the caulking structure. The guide member 20 may be in physically contact with the crystal-grown single crystal C, in which the guide member 20 can be prevented from falling off.

Figure 9:
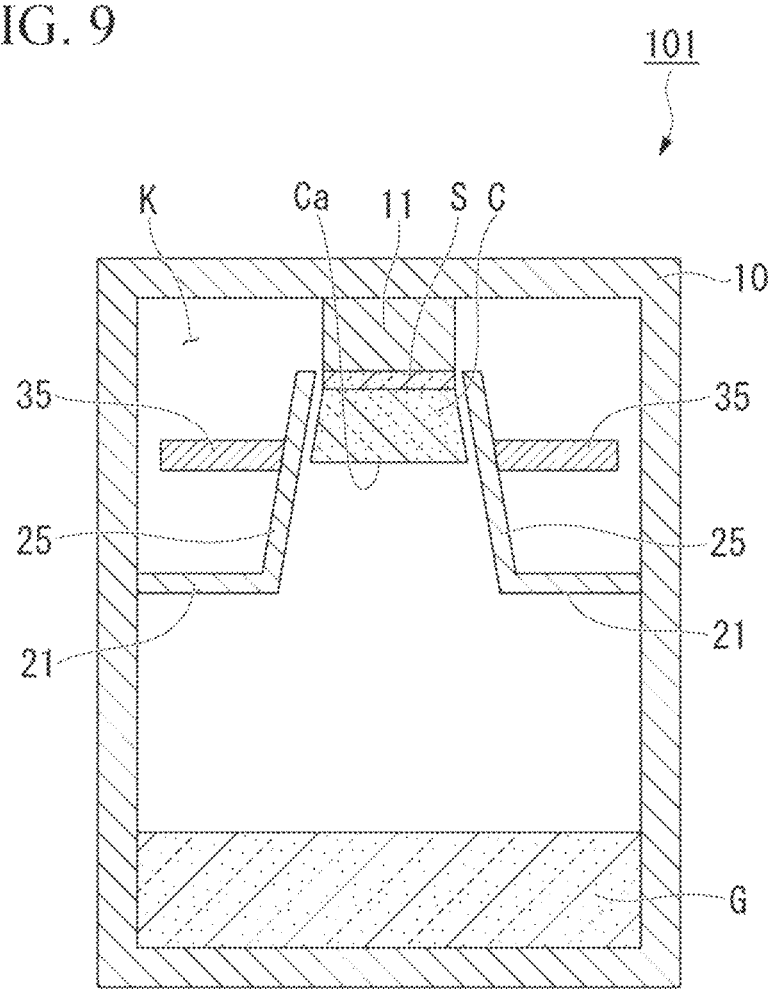
FIG. 9 is a schematic cross-sectional view of another example SiC single crystal manufacturing apparatus.

The guide member 20 in FIG. 8 extends vertically in the vertical direction. The shape of the guide member 20 is not limited to the shape shown in FIG. 8, and examples of the shape includes a tubular shape such as a cylindrical shape, and a truncated cone. A thickness of the guide member may be uniform. A length, an inner diameter and an outer diameter of the member may be optionally selected. FIG. 9 is a schematic cross-sectional view showing another example of the SiC single crystal manufacturing apparatus 101 according to the embodiment. The guide member 25 in FIG. 9 is expanded in diameter toward the raw material G from the seed crystal installation part 11. The diameter of the single crystal C can be increased by expanding the diameter of the guide member 25.

An upper end of the guide member 20 is open in the example shown in FIG. 8. However, the upper end of the guide member 20 may be connected to an inner surface of the crucible 10 to close a space where the heat-insulating member 30 is provided.

A surface of the guide member 20 is preferably coated with tantalum carbide. The guide member 20 is always exposed to the raw material gas to control the flow of the raw material gas. For example, in a case where the guide member 20 is formed of graphite and the guide member 20 is used while graphite is completely exposed, graphite may react with the raw material gas to be deteriorated and get damaged. Deterioration and damage of graphite may cause the guide member 20 to be perforated, and also cause a phenomenon that carbon powder peeled by degradation is taken into the single crystal C and the quality of single crystal C becomes worse. Meanwhile, tantalum carbide can tolerable to high temperature and does not cause an undesirable reaction with the raw material gas. Therefore, high-quality SiC single crystal growth can be stably performed. The guide member 20 may be formed of tantalum carbide only.

The heat-insulating member 30 is movable along an extension direction of the guide member 20 on the outside of the guide member 20. The outside of the guide member 20 may indicate an outer surface side of the guide member. A position of a surface Ca of the single crystal C can move due to growth. The heat-insulating member 30 is moved, whereby it is possible to control a positional relationship between an end surface on a raw material G side of the heat-insulating member 30 (hereinafter referred to as a lower surface 30a) and the surface Ca of the single crystal C. Therefore, a temperature distribution in the vicinity of the surface Ca of the single crystal C can be freely controlled, and a surface shape of the crystal-grown single crystal C can also be freely controlled. In the process of crystal growth, the positional relationship between the end surface 30a on the raw material side of the heat-insulating material 30 and the surface Ca of the single crystal C can be controlled. In addition, the end surface 30a on the raw material side of the heat insulating material 30 can be located within 20 mm from the surface Ca of the single crystal C during the crystal growth process. Further, in the process of crystal growth, the end surface 30a on the raw material side of the heat-insulating material 30 can be located closer to the seed crystal installing portion 11 with respect to the surface Ca of the single crystal C. The thickness of the heat-insulating material 30 can be set to half or less of the growth amount of the SiC single crystal ingot manufactured to be 0.2 mm or more.

Figure 10A:
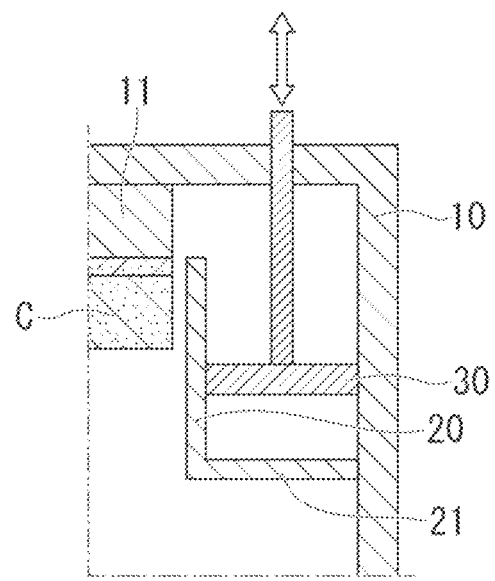
FIG. 10A is a schematic cross-sectional view of the driving means for moving the heat-insulating member up and down in the SiC single crystal manufacturing apparatus.
Figure 10B:
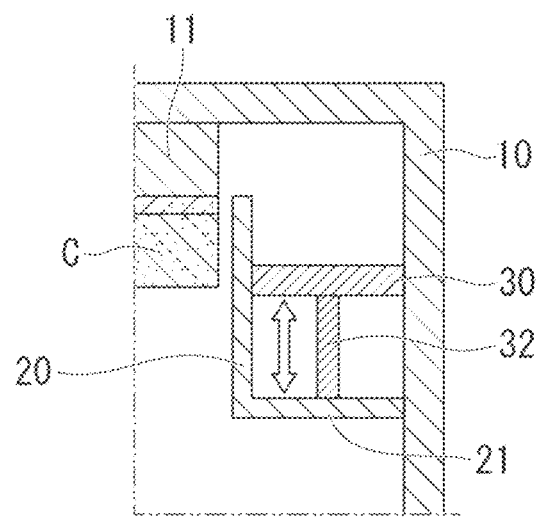
FIG. 10B is a schematic cross-sectional view of the driving means for moving the heat-insulating member up and down in the SiC single crystal manufacturing apparatus.
Figure 10C:
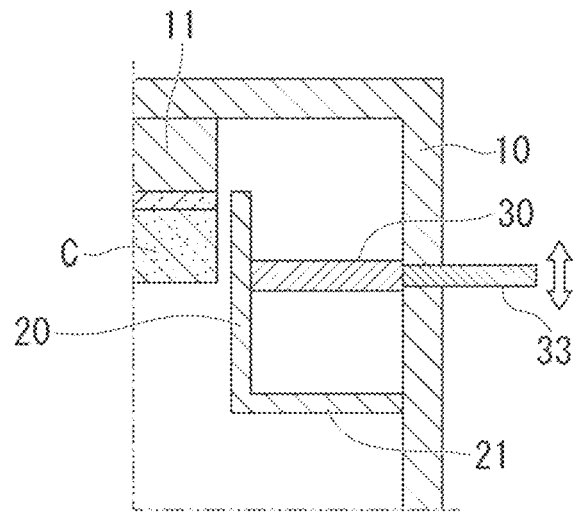
FIG. 10C is a schematic cross-sectional view of the driving means for moving the heat-insulating member up and down in the SiC single crystal manufacturing apparatus.

FIGS. 10A to 10C are schematic cross-sectional views, each showing a preferred example of a driver for moving the heat-insulating member 30 up and down. The driver is not particularly limited as long as the heat-insulating member 30 can be moved in the vertical direction. For example, as shown in FIG. 10A, a driving member 31 extending to the outside of the crucible 10 from an upper portion of the heat-insulating member 30 may be provided to move the heat-insulating member 30 by pushing and pulling the driving member up and down. An upper surface of the crucible 10 may be provided with a notch or an opening for passing the driving member. For example, as shown in FIG. 10B, a lift-type driving member 32 may be provided such that the heat-insulating member 30 may be supported front a lower portion thereof. For example, as shown in FIG. 10C, a notch or opening may be provided in part of a side surface of the crucible 10, and a driving member 33 extending to the outside of the crucible 10 may be provided through the notch or opening to move the heat-insulating member 30 by raising and lowering the driving member.

The heat-insulating member 30 is preferably made of a material having thermal conductivity of 40 W/mk or less at high temperature of 2000° C. or more. Examples of the material having thermal conductivity of 40 W/mk or less at high temperature of 2000° C. or more include a graphite member having thermal conductivity of 120 W/mk or less at normal temperature. Moreover, it is more preferable that the heat-insulating member 30 is formed of a material having thermal conductivity of 5 W/mk or less at high temperature 2000° C. or more. Examples of the material having thermal conductivity of 5 W/mk or less at high temperature 2000° C. or more include a felt material mainly containing graphite and carbon.

The shape of the heat-insulating member 30 is appropriately designed in accordance with a shape of a region sandwiched by the guide member 20 and the inner surface of the crucible 10. The shape of the heat-insulating member can be optionally selected, and may be, for example, donut shaped. As shown in FIG. 8, in a case where a distance between the guide member 20 and the inner surface of the crucible 10 is constant, the heat-insulating member 30 can be arranged to fill in a gap between them. As shown in FIG. 9, in a case where the distance between the guide member 25 and the inner surface of the crucible 10 varies, the shape of the heat-insulating member 30 can be designed in accordance with the position at which the gap between them is the narrowest such that a width of the heat-insulating member 30 is adjusted to be the same as or smaller than a distance at which the gap between them is the narrowest. With such a design, the heat-insulating member 35 is movable, and immovable clogging between the guide member 25 and the inner surface of the crucible 10 can be avoided.

The thickness of the heat-insulating member 30 can be optionally selected, but preferably 0.2 mm or more, more preferably 5 mm or more, still more preferably 20 mm or more. In a case where the heat-insulating member 30 is too thin, a sufficient heat-insulating effect may not be achieved. It is preferable that the thickness of the heat-insulating member 30 is half or less of a length of the single crystal finally manufactured. The length of the single crystal indicates a length in the vertical direction of the single crystal C after crystal growth (the growth amount of the single crystal C). In a case where the growth amount of the single crystal is 100 mm, the thickness of the heat-insulating member 30 is preferably 50 mm or less. In a case where the growth amount of the single crystal is 50 mm, the thickness of the heat-insulating member 30 is preferably 25 mm or less. In a case where the thickness of the heat-insulating member 30 is too thick, the movement of the heat-insulating member 30 is inhibited. If the thickness of the heat-insulating member 30 falls within the range described above, a temperature difference can be formed in the vertical direction within the single crystal C via the heat-insulating member 30. Consequently, it is possible to prevent the raw material gas from being recrystallized in a portion other than the surface Ca of the single crystal C.

As described above, according to the above-described SiC single crystal manufacturing apparatus, the position of the heat-insulating member can be controlled relatively to the crystal-grown single crystal. It is possible to freely control the temperature distribution in the vicinity of the surface of the single crystal C during crystal growth by controlling the position of the heat-insulating member. Since the single crystal C grows along an isothermal surface, controlling the temperature distribution in the vicinity of the surface of the single crystal C leads to controlling the shape of the single crystal C.

A growth method of a SiC single crystal uses the SiC single crystal manufacturing apparatus stated above. Hereinafter, a case where the SiC single crystal manufacturing apparatus 100 as shown in FIG. 8 is employed will be described as an example.

In the fabrication process of the SiC single crystal ingot, single crystal C is grown on seed crystal S installed in the seed crystal installation part 11. Single crystal C grows as the source gas sublimated from the source G recrystallizes on the surface of the seed S. The raw material G is sublimated by heating the crucible 10 by an external heating means. The sublimated raw gas is fed along the guide member 20 toward the seed crystal S.

In the growth method of the SiC single crystal according to the present embodiment, the positional relationship between the lower surface 30a of the heat-insulating member 30 and the surface Ca of the single crystal C is controlled in a process of performing crystal growth of the single crystal C from the seed crystal S. The shape of the surface Ca of the single crystal C can be freely controlled by controlling such a positional relationship.

Figure 11A:
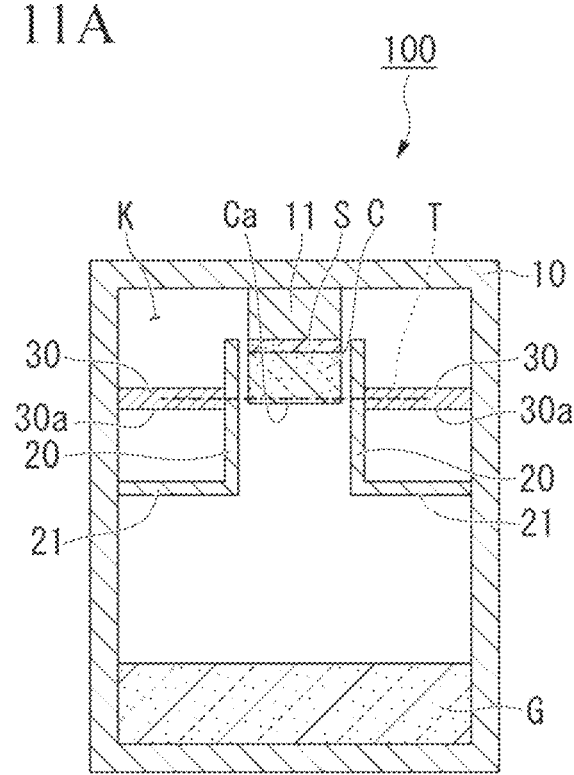
FIG. 11A is the positional relationship between the bottom surface of the heat-insulating member and the surface of the single crystal, and the relationship between the positional relationship and the isothermal surface in the vicinity of the single crystal.
Figure 11B:
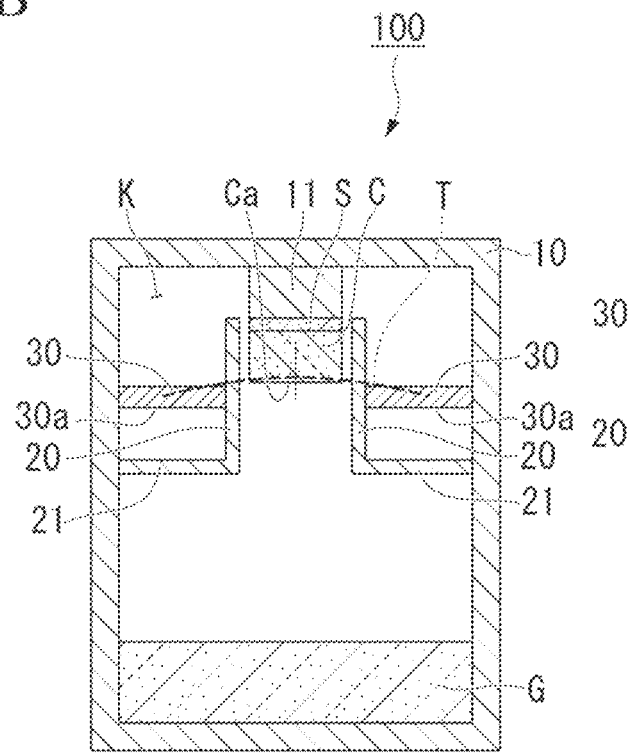
FIG. 11B is the positional relationship between the bottom surface of the heat-insulating member and the surface of the single crystal, and the relationship between the positional relationship and the isothermal surface in the vicinity of the single crystal.
Figure 11C:
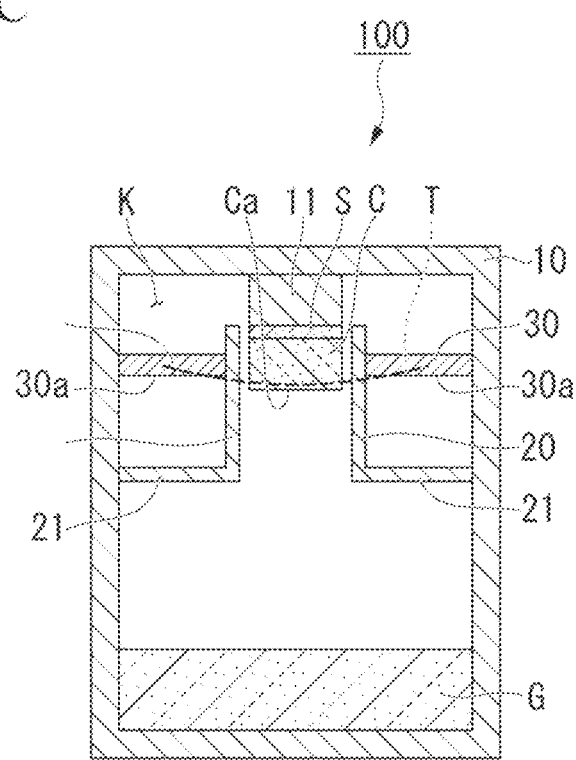
FIG. 11C is the positional relationship between the bottom surface of the heat-insulating member and the surface of the single crystal, and the relationship between the positional relationship and the isothermal surface in the vicinity of the single crystal.

FIG. 1 shows the positional relationship between the lower surface 30a of the heat-insulating member 30 and the surface Ca of the single crystal C, and the relationship between the positional relationship and the isothermal surface in the vicinity of the single crystal C. FIG. 11A is an example in a case where the surface Ca (crystal growth surface) of the single crystal C is flat. FIG. 11B is an example in a case where the surface Ca (crystal growth surface) of the single crystal C is concave. FIG. 11C is an example in a case where the surface Ca (crystal growth surface) of the single crystal C is convex.

As shown in FIGS. 11A to 11C, the shape of the surface Ca of the single crystal C varies depending on the position of the heat-insulating member 30 with respect to the surface Ca of the single crystal C. As shown in FIG. 11A, in a case where the position of the surface Ca of the single crystal C and the position of the lower surface 30a of the heat-insulating member 30 are substantially the same, the surface Ca of the single crystal C is flat. As shown to FIG. 11B, in a case where the lower surface 30a of the heat-insulating member 30 is disposed closer to the raw material G side than the surface Ca of the single crystal C, the surface Ca of the single crystal C is concave. As shown in FIG. 11C, in a case where the surface Ca of the single crystal C is disposed closer to the raw material G than the lower surface 30a of the heat-insulating member 30, the surface Ca of the single crystal C is convex. That is, a convex shape is formed downward. A dotted line in the drawing indicates the isothermal surface T.

Figure 12A:
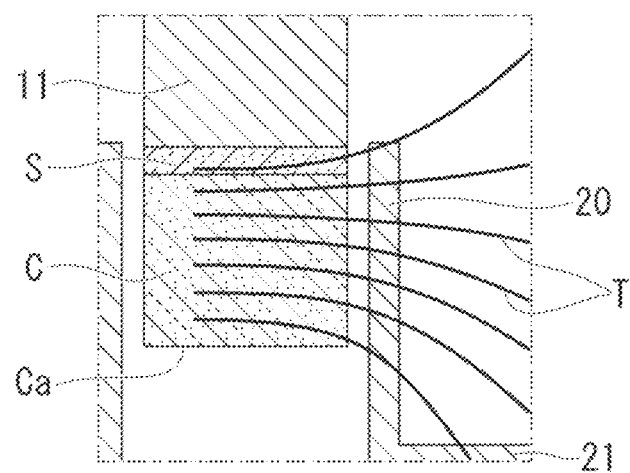
FIG. 12A is a schematic diagram illustrating the shape of the isothermal surface near a single crystal during crystal growth.
Figure 12B:
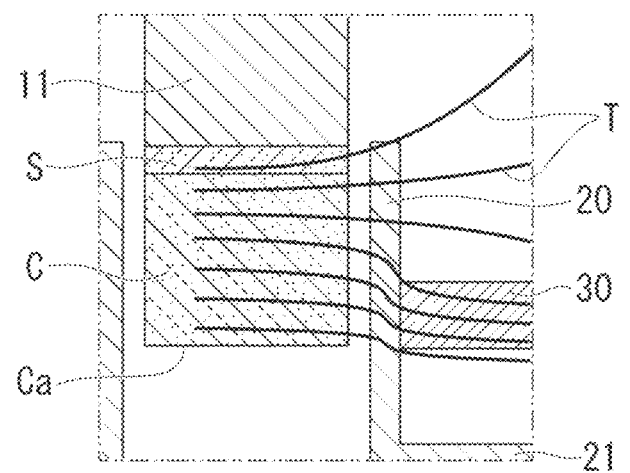
FIG. 12B is a schematic diagram illustrating the shape of the isothermal surface near a single crystal during crystal growth.

The shape of the surface Ca of the single crystal C varies depending on the position of the heat-insulating member 30 with respect to the surface Ca of the single crystal C because the shape of the isothermal surface T varies in the film formation space K. FIGS. 12A and 12B are diagrams schematically showing the shape of the isothermal surface T in the vicinity of the single crystal C during crystal growth. FIG. 12A is a view in a case where the heat-insulating member 30 is not provided. FIG. 12B is a view in a case where the heat-insulating member 30 is provided.

The single crystal C of SiC has a thermal insulation effect due to its low thermal conductivity. Meanwhile, the guide member 20 has higher thermal conductivity than that of the single crystal C. Consequently, as shown in FIG. 12A, the isothermal surface T in a case where the heat-insulating member 30 is not provided is formed so as to expand front the single crystal C. The crystal growth surface of the single crystal C grows along the isothermal surface T. Therefore, in a case where the heat-insulating member 30 is not provided, the shape of the surface Ca (crystal growth surface) of the single crystal C is fixed in a concave shape.

On the other hand, in a case where the heat-insulating member 30 is provided as shown in FIG. 12B, the shape of the isothermal surface T varies. The shape of the isothermal surface T can be freely designed by controlling the position of the heat-insulating member 30 with respect to the single crystal C. Controlling the position may correspond to moving the position in at least one of a lateral direction, a longitudinal direction, and an oblique direction. Designing the shape of the isothermal surface T can be carried out with high accuracy by confirming the shape in advance by simulation or the like. Thus the shape of the surface Ca of the single crystal C can be freely designed by controlling the position of the heat-insulating member 30 with respect to the single crystal C.

In addition, controlling the position of the heat-insulating member 30 with respect to the single crystal C provides the advantageous effects of suppressing adhesion of polycrystals to the guide member 20 and of reducing the temperature difference in an in-plane direction in the single crystal C.

Polycrystals are formed in a low temperature portion in the vicinity of the crystal growth surface of single crystal C. For example, as shown in FIG. 12A, in a case where the temperature difference between the single crystal C and the guide member 20 is large, polycrystals grow on the guide member 20. If the polycrystals grown on the guide member 20 comes in contact with the single crystal C, the crystallinity of the single crystal C is disturbed to cause defects. On the other hand, as shown in FIG. 12B, in a case where the heat-insulating member 30 is in the vicinity of the surface Ca of the single crystal C, the temperature difference between the single crystal C and the guide member 20 can be reduced, thereby suppressing growth of polycrystals.

Additionally, if the temperature difference in the in-plane direction in the single crystal C is large, stress occurs in the process of growing the single crystal C. The stress occurred in the single crystal C produces distortion, deviation or the like, in a crystal plane. Distortion in the single crystal C or the deviation of a lattice plane may cause killer defects such as basal plane dislocation (BPD).

The detailed description has been described that the shape of the surface Ca (lower main surface) of the single crystal C can be controlled. The shape of the surface Ca of the single crystal C is preferably flat or convex toward the raw material G, because if the shape of the surface Ca of the single crystal C is concave toward the raw material G, the quality is inferior. Adjusting the shape of the surface Ca of the single crystal C to be flat or convex, the positions of the surface Ca of the single crystal C and the lower surface 30a of the heat-insulating member 30 are substantially the same, or alternatively, the surface Ca of the single crystal C is disposed closer to the raw material G than the lower surface 30a of the heat-insulating member 30.

The term "substantially the same" does not mean that the positions of the surface Ca of the single crystal C and the lower surface 30a of the heat-insulating member 30 must be completely at the same height; it means that slight misalignment is allowed to the extent which the isothermal surface T is not greatly affected. In particular, if the lower surface 30a of the heat-insulating member 30 is disposed within 30 mm from the surface Ca of the single crystal C, the surface Ca of the single crystal C and the lower surface 30a of the heat-insulating member 30 have the positional relationship that they are substantially the same. In order to adjust the shape of the surface Ca of the single crystal C to be flat, it is preferable that the surface Ca of the single crystal C and the lower surface 30a of the heat-insulating member 30 has the positional relationship that they are nearly identical. It is also preferable that the lower surface 30a of the heat-insulating member 30 is disposed within 20 mm from the surface Ca of the single crystal C, more preferable that the lower surface 30a of the heat-insulating member 30 is disposed within 10 mm.

The surface Ca of the single crystal C is preferably disposed closer to the raw material G than the lower surface 30a of the heat-insulating member 30. That is, it is preferable that the lower surface 30a of the heat-insulating member 30 is disposed closer to the seed crystal installation part 11 than the surface Ca of the single crystal C. Accordingly, even when an external factor such as a temperature fluctuation in the film forming space K occurs, the concave shape of the surface Ca of the single crystal C can be prevented.

It is preferable to control the position of the heat-insulating member 30 from the start of crystal growth. That is, it is preferable to control the positional relationship between the lower surface 30a of the heat-insulating member 30 and the surface of the seed crystal S at the start of crystal growth.

Immediately after the start of crystal growth, the seed crystal installation part 11 is provided around the seed crystal S, and a distance between the seed crystal S and the crucible 10 is also close. Therefore, the isothermal surface T in the film formation space K is also influenced by temperature (thermal conductivity) of these members. That is, the effect exerted by using the heat-insulating member 30 is the strongest in a region where the single crystal C has grown 30 mm or more from the seed crystal S. However, it does not mean that the heat-insulating member 30 does not provide any advantageous effect immediately after the start of crystal growth.

For example, in a case where the shape of the crystal growth surface of single crystal C immediately after crystal growth is concave without providing the heat-insulating member 30, it is necessary to return the shape of the crystal growth surface of the single crystal C to a convex shape in the subsequent growth process. If the shape of the crystal growth surface changes from concave to convex in the growth process, stress is accumulated in the single crystal C, and defects are likely to occur. Therefore, the position of the heat-insulating member 30 is preferably controlled from the start of crystal growth. The positional relationship of the heat-insulating member 30 to the seed crystal S can be designed in the same manner as the positional relationship between the heat-insulating member 30 and the single crystal C in the process of crystal growth.

As described above, the fabrication process of SiC single crystal ingots is similar to that of ordinary SiC single crystal ingots in that it has a preparation process for arranging the SiC raw powder and seed crystals in the crystal growth chamber, a temperature raising process for raising the temperature to the crystal growth temperature at which the SiC raw powder sublimes, a single crystal growth process for growing the SiC single crystal on the seed crystal, and a temperature lowering process for lowering the temperature in the crystal growth chamber after growing the SiC single crystal to a specified length. On the other hand, in the fabrication process of SiC single crystal ingots in the present embodiment, in order to adjust the amount and the distribution of non-MP defects in SiC single crystal ingot, (i) after the SiC single crystal ingot is grown, and in the temperature lowering process, the SiC single crystal ingot is cooled under specified conditions, or (ii) the SiC single crystal ingot is annealed under specified conditions between the single crystal growth process and the temperature lowering process.

(i) Cooling Process Under Specified Conditions (Temperature Lowering Process)

In order to adjust the amount and distribution of non-MP defects in SiC single crystal ingot, in the cooling process from a growth temperature of over 2000° C. to room temperature (about 25° C.), the cooling rate from the growth temperature of over 2000° C. to 1500° C. after growth is controlled to be in the range of 100° C./h to 320° C./h, and the cooling rate from 1500° C. to room temperature is controlled to be in the range of 50° C./h to 300° C./h.

(ii Annealing Process of the Grown SiC Single Crystal Ingot Under Specified Conditions Between the Single Crystal Growth Process and the Temperature Lowering Process (Annealing Process).

The grown SiC single crystal ingot is annealed in an inert atmosphere.

A SiC single crystal ingot and a Si source are placed in a graphite container to suppress carbonization of the surface of the ingot. Typical Si sources include Si, SiC, and $Si_3N_4$, but are not limited to these. From a cost point of view, it is desirable to do it in an argon atmosphere. The container may be filled with graphite powder to help control the temperature gradient.

In addition, the heating means and the heat-insulating member 30 are adjusted so that the temperature gradient of the SiC single crystal ingot in the radial direction is 20° C./cm or less and the temperature gradient of the SiC single crystal ingot in the growth direction is in the range of 0° C./cm to 50° C./cm, and the ingot is annealed at 1800° C. to 2000° C. for 10 hours to 20 hours.

<Fabrication Process of SiC Single Crystal Substrate>

In the process of fabricating a SiC single crystal substrate front the obtained SiC single crystal ingot (hereafter, it may be referred to as a substrate fabrication process.), a SiC single crystal substrate can be obtained by performing ordinary substrate processing (cylindrical processing, slicing to polishing). For example, it includes a flattening process including lapping, a process of removing a work-affected layer (work-altered layer), etc. As described above, in order to adjust the amount and the distribution of non-MP defects in SiC single crystal ingots, a cooling step of cooling the SiC single crystal ingot under the specified conditions after the growth ((i)), an annealing step of annealing the SiC single crystal ingot under the specified conditions after the growth ((ii)), or both (i) and (ii) can be performed in the fabrication process of the SiC single crystal ingot, but instead of or in addition to them, in the substrate fabrication process, (iii) a substrate annealing step of annealing the SiC single crystal substrate under specified conditions after slicing the SiC single crystal ingot to adjust the amount and the distribution of non-MP defects in the SiC single crystal substrate may be performed. The following describes the substrate annealing process and the lapping process using the characteristic slurry. Other known methods can be used for processing from SiC single crystal ingots to SiC single-crystal substrates.

In the substrate annealing process, the SiC single crystal ingot is sliced and then annealed. It may be done after each step in the substrate fabrication process. In the case of insufficient adjustment of the density of non-MP etch pits in SiC single crystal ingot fabrication process, that is, in the case of insufficient adjustment of the density of non-MP etch pits in (i) a cooling process (temperature lowing process) of cooling the SiC single crystal ingot under the specified conditions and/or in (ii) an annealing process of annealing the SiC single crystal ingot under the specified conditions between the single crystal growth process and the temperature lowering process, (iii) the substrate annealing process of annealing the SiC single crystal substrate may be performed as an additional annealing process.

Because the surface roughness of the substrate is increased by annealing, it is not desirable from a cost point of view to perform annealing after the final polished finish, but it can be performed again. It is preferable to perform annealing at a stage where the substrate surface roughness before polishing is large.

Figure 6:
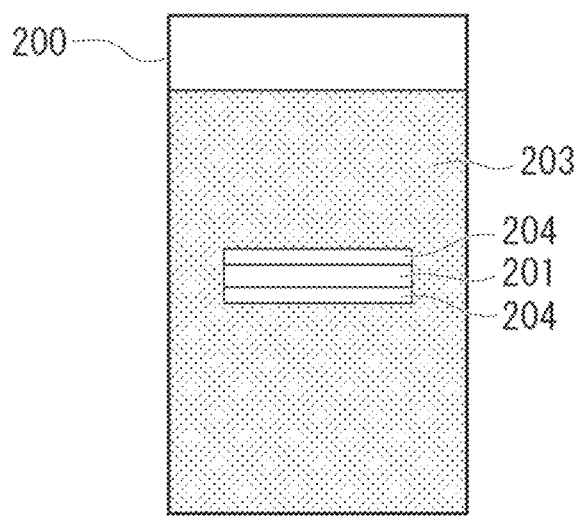
FIG. 6 is a schematic cross sectional view of an annealing crucible for performing a substrate annealing process.

FIG. 6 is a schematic cross section of an annealing crucible to illustrate the implementation of a substrate annealing process using an annealing crucible as an example for performing a substrate annealing process.

The substrate annealing process is described using the annealing crucible 200 shown in FIG. 6.

The substrate annealing process includes steps of preparing a sliced substrate 201, placing a Si source in a graphite container 200, placing the target substrate 201 in the container, placing them in the heating device, and annealing. The process of placing the Si source may be performed in conjunction with the process of placing the target substrate in the container 200. To form the desired temperature distribution, the container 200 may be filled with graphite powder 203 or a graphite member may be arranged. Annealing conditions can be the same as those for the SiC single crystal ingot, for example, the annealing process is carried out in an inert atmosphere such as argon at a temperature in the range of 1800° C. to 2000° C. for about 10 hours to 20 hours.

As shown in FIG. 6, the SiC single crystal substrate 201 to be subjected to the substrate annealing process may be placed at the center of the annealing crucible 200, for example, and the substrate annealing process may be performed with the SiC single crystal substrate 201 sandwiched between dummy wafers 204 to prevent the surface carbonization of the SiC single crystal substrate 201.

Annealing conditions in the substrate annealing process include, for example, holding at 1950° C. for 20 hours in an argon (Ar) atmosphere (for example, 700 Torr).

For the measurement of non-MP defect density, molten KOH etching is performed after grinding the surface with the same amount that will be ground regardless of whether the substrate annealing process is performed.

Figure 7:
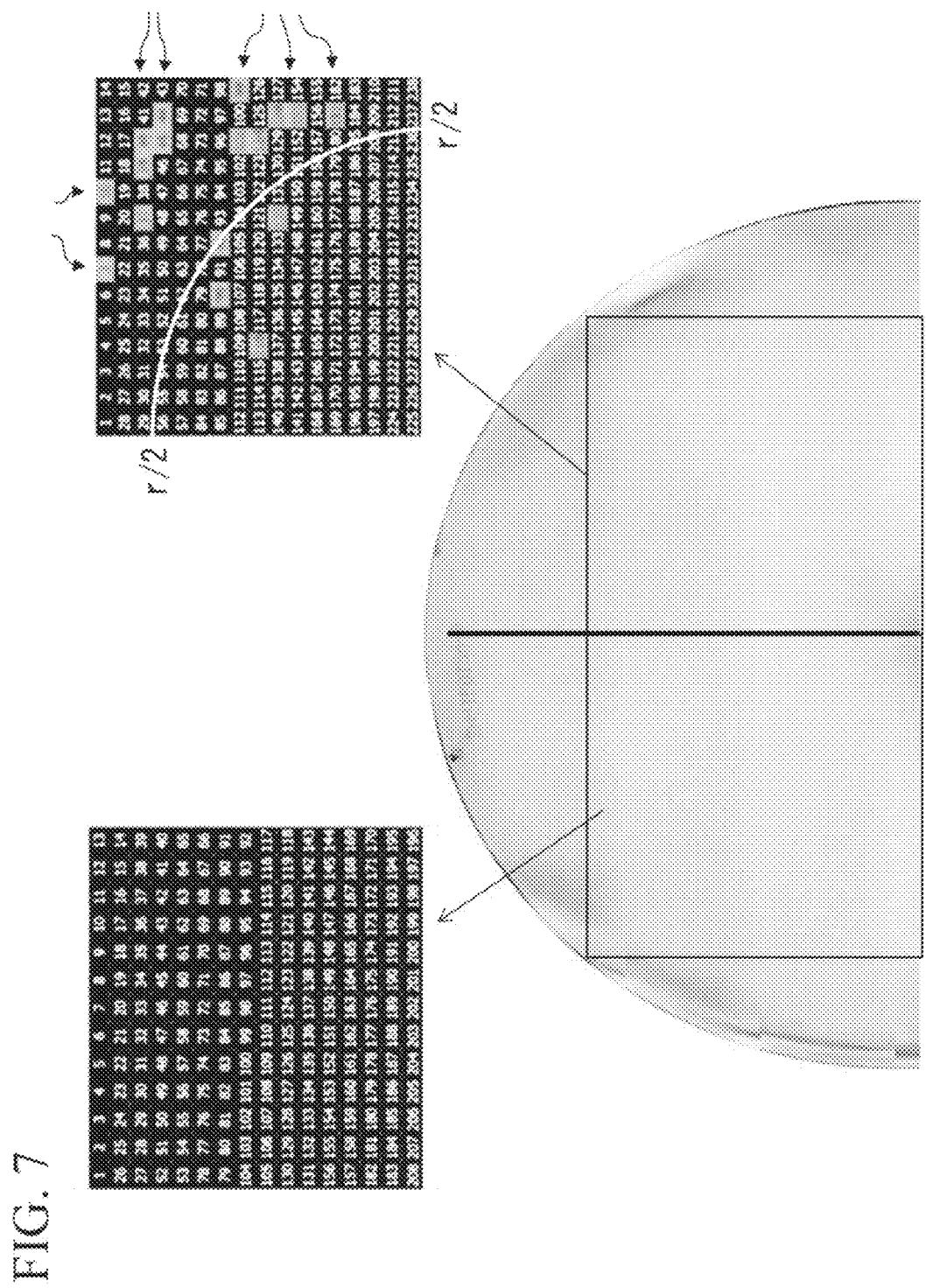
FIG. 7 shows an XRT image (g(1-100)) of a SiC single-crystal substrate on the right, an optical microscope image after molten KOH etching of a sample without substrate annealing on the lower left, and an optical microscope image after molten KOH etching of a sample with substrate annealing on the upper left.

In FIG. 7, the right side shows the XRT image (g(1-100)) of the SiC single-crystal substrate. The shades corresponding to the defects are not visible in this XRT image. The lower left and upper left views in FIG. 7 show the presence or absence of non-MP etch pits for each division area in the optical microscope image after molten KOH etching. The figure on the lower left shows that the substrate annealing process was not performed, and the figure on the upper left shows that the substrate annealing process was performed. No etch pits can be seen in the lower left figure where the substrate annealing process was not performed, but many non-MP etch pits can be seen in the upper left figure where the substrate annealing process was performed, as indicated by arrows. Thus, non-MP etch pits can be increased by substrate annealing. That is, the non-MP etch pit density can be adjusted by annealing the substrate.

Also, in the upper left view of FIG. 7, it can be seen that the increase of non-MP etch pits is larger in the outer region than in the central region. Thus, the ratio of non-MP etch pit densities in the central and outer regions can be adjusted by the annealing conditions in the substrate annealing process.

Next, the available lapping slurries are detailed.

In the processing process of the free abrasive grain method, slurry containing, for example, water, boron carbide abrasive grains, and an additive for dispersing the boron carbide abrasive grains is supplied between the upper and lower surface plates, and pressure is applied to the SiC substrate 1 by the upper surface plate 21 and the lower surface plate to flatten the surface of the SiC substrate 1. The slurry used in the processing process is a slurry containing, for example, water as the main component. When a slurry containing water as the main component is used, the dispersibility of the boron carbide abrasive grains is enhanced and secondary aggregation is less likely to occur in the processing process. When a slurry containing water as a main component is used, the surface of the SiC substrate on the upper surface plate side where the slurry feed hole is provided is cleaned by the direct supply of water, and the surface of the SiC substrate on the lower surface plate side where the slurry feed hole is not provided is cleaned by the water supplied through the gap between the SiC substrate and the carrier plate. The slurry used in the lapping process is collected in a tank and fed again from the tank.

The modified Mohs hardness (14) of the boron carbide abrasive grain is slightly larger than the modified Mohs hardness (13) of the SiC substrate as an object to be polished and smaller than the modified Mohs hardness (15) of the diamond. Therefore, by using such a slurry, the processing speed can be relatively increased while the generation of cracks on the SiC substrate having the modified Mohs hardness (13) is suppressed, and the decrease in the grain size of the boron carbide abrasive grain can be suppressed.

The ratio of boron carbide abrasive grains in the slurry is, for example, 15 mass % or more and 45 mass % or less, preferably 20 mass % or more and 40 mass % or less, and more preferably 25 mass % or more and 35 mass % or less. When the ratio of the boron carbide abrasive grains in the slurry is 15 mass % or more, the content of the boron carbide abrasive grains in the slurry can be increased and the processing speed of the lapping process can be enhanced. In addition, when the ratio of the boron carbide abrasive grains in the slurry is 45 mass % or less, the frequency and area of contact between the boron carbide abrasive grains can be suppressed, and it is easy to suppress the decrease in the grain size of the boron carbide abrasive grains and the abrasion of the boron carbide abrasive grains.

The boron carbide abrasive grain in the slurry used in the processing process has an average grain size of, for example, 15 µm or more and 40 µm or less is preferably 25 µm or more and 35 µm or less. By using boron carbide abrasive grains with an average grain size of 15 µm or more, it is easy to increase the processing speed for lapping the surface of the SiC substrate 1, and furthermore, it is possible to attach sufficient additives to the surface, which leads to improvement in dispersibility and suppression of decrease in grain size. In addition, by making the average grain size less than 40 µm, it is easy to obtain the effect of suppressing cracks or fissures in the SiC substrate, and furthermore, it is possible to suppress the excessive adhesion of additives described later to the surface and to suppress the decrease in the processing speed due to the decrease in the contact area with the SiC substrate as a workpiece. In addition, by using such boron carbide abrasive grains, it is easy to suppress the change in particle size before and after lapping. Here, the average grain size of the above boron carbide abrasive grain is the average grain size of the boron carbide abrasive grain before processing, and the average grain size of the boron carbide abrasive grain after processing is, for example, 14 µm or more and 48 µm or less, and preferably 23 µm or more and 42 µm or less, because the ratio of the average grain size of the boron carbide abrasive grain before and after processing is 0.91 to 1.2.

Here, the average grain size of the boron carbide abrasive grain is measured based on the particle size distribution measured by laser scattering light measurement using a particle size distribution measuring device Mastersizer Hydro 2000 MU (Spectris Co., Ltd.) or MT 3000 Type II (Microtrack Bell Co., Ltd.).

As an additive, polyalcohols, esters and their salts, homopolymers and their salts, copolymers and the like can be used. Specific examples include one or more substances selected from the group consisting of glycerin, 1-vinylimidazole, sodium palm oil fatty acid methyl taurine, sodium laurate amide ether sulfate, sodium myristate amide ether sulfate, polyacrylic acid and acrylic acid-maleic acid copolymers.

These additives are thought to enhance the dispersibility of boron carbide abrasive grains in the slurry.

The additive adheres to the surface of the boron carbide abrasive grain and inhibits direct contact between the boron carbide abrasive grains. In this way, the additive enhances the dispersibility of the boron carbide abrasive grains in the slurry and suppresses the grain size reduction of the abrasive grains in the processing process.

The percentage of the additive in the slurry is, for example, 3 volume % or more and 20 volume % or less, preferably 5 volume % or more and to 15 volume % or less, and preferably 10 volume % or more and to 15 volume % or less. Here, the ratio of additive in the slurry refers to the ratio of the volume of additive (additive components) such as glycerin divided by the volume of the slurry. When the additive in the slurry is within the above range, it adheres to the surface of the boron carbide in the slurry in a necessary and sufficient manner to obtain a favorable degree of dispersion of the boron carbide abrasive grain in the slurry, and it is easy to suppress the decrease in the grain size of the boron carbide abrasive grain in the processing process.

In this lapping process, the processing speed for processing the surface of the SiC substrate in the processing process is, for example, 14 µm/h or more and 45 µm/h or less, preferably from 16 µm/h or more and 40 µm/h or less, and more preferably from 18 µm/h or more and 25 µm/h or less. The processing speed depends on the processing pressure described above and the average grain size of the boron carbide abrasive grains. It is easy to obtain the effect of suppressing reduction of the grain size of the boron carbide abrasive grain and suppressing the abrasion of the boron carbide abrasive grain by setting the processing speed to 45 µm/h or less. The throughput can be increased by increasing the processing speed to 14 µ/h or more. When lapping processing is performed in multiple batches, the processing speed obtained by dividing the total change in the thickness of the SiC substrate by the total processing time may be within the above range, and it is preferable that the processing speed at any timing is within the above range. That is, when lapping is performed in multiple batches, it is preferable that the processing speed calculated in each batch is within the above range.

Here, the processing speed is calculated from the difference in the thickness of the SiC substrate 1 before and after lapping and the processing time. Specifically, the processing speed is calculated by the following method. The measurement positions of the thickness of the SiC substrate 1 are position 1c corresponding to the center of the SiC substrate before the formation of the orientation flat OF on the SiC substrate 1, position 1a being 5 mm to 10 mm away from the midpoint of the orientation flat OF toward the position 1c, position 1b on the same straight line c as positions 1a and 1c and being 5 mm to 10 mm away in the direction of position 1a from the outer periphery of the SiC substrate 1, and positions 1d and 1e on the straight line perpendicular to the straight line c and being 5 mm to 10 mm away in the direction of position 1a from the outer periphery of the SiC substrate 1. The thickness of SiC substrate 1 at these five positions 1a to 1e is measured by an indicator (ID-C 150 XB, made by Mitsutoyo), and the obtained thickness is treated as the thickness of SiC substrate 1. The processing speed is calculated by dividing the difference in the thickness (micrometers) of the SiC substrate 1 before and after the processing thus obtained by the processing time (h).

Adhesion of additives to the surface of the boron carbide abrasive grains in the slurry used in the processing process increases the dispersibility of the boron carbide abrasive grains, and the contact of the boron carbide abrasive grains can be suppressed, so that the decrease in the grain size of the boron carbide abrasive grains can be suppressed.

Specifically, the change in the grain size of the boron carbide abrasive grain can be suppressed to the extent that the ratio of the average grain size of the boron carbide abrasive grain after processing to the average grain size of the boron carbide abrasive grain before processing is 0.91 to 1.2 in the processing process. The reason why the ratio includes a value greater than 1 is that, in the processing process, boron carbide abrasive grains are secondarily agglomerated, and the grain size of some boron carbide abrasive grains may be larger than that before processing.

In the conventional lapping process, since the grain size of the boron carbide abrasive grain in the slurry is greatly reduced by lapping process, it is necessary to add abrasive grain to the slurry each time the lapping process is performed again, and each time it is necessary to carry out complicated management to obtain the distribution of the grain size of the abrasive grain in the slurry depending on the number of batches used for lapping process.

In this way, this lapping process facilitates the management of the grain size of the boron carbide abrasive grain and reduces the cost, in addition to reducing the environmental load and suppressing the occurrence of cracks.

In addition, since the grain size of the boron carbide abrasive grains does not change much in this lapping process, the change in the processing speed during lapping process can be restrained and the lapping process can be continued under the same conditions. This lapping process is particularly effective when using boron carbide, which has a slightly higher modified Mohs hardness than silicon carbide as an object to be polished. Because such abrasive grains and substrates are used in this lapping process, it is also possible to suppress cracks that occur frequently when diamond is used as abrasive grains and SiC substrates are used as objects to be polished.

In addition, since this lapping process can suppress the decrease in the grain size and abrasion of the boron carbide abrasive grain, the dispersion of the grain size of the boron carbide abrasive grain in the slurry during lapping process is reduced. While the processing speed of the lapping process depends on the grain size of the abrasive grain used, in this lapping process, since the variation in the grain size of the abrasive grain can be suppressed, the whole surface of the SiC substrate is processed by the abrasive grain of approximately equal grain size, and the in-plane variation of the substrate thickness of the SiC substrate after processing is reduced.

EXAMPLES

Examples of the disclosure are described below, but the disclosure is not limited to the following examples.

Example 1

First, a single crystal ingot was fabricated using the SiC single-crystal manufacturing apparatus shown in FIG. 8.

A 4H—SiC single crystal having a surface with an off angle of 4° with respect to the (0001) plane, as a main surface, a diameter of 200 mm and a thickness of 5.0 mm was used as the seed crystal S. In accordance with the crystal growth, the crystal growth was carried out while gradually moving the heat-insulating member 30 so that the end face (lower surface 30a in FIG. 1C) of the raw material side of the heat-insulating member 30 was closer to the lid than the growth surface of the single crystal and the distance in the growth direction between the end face of the raw material side of the heat-insulating member 30 and the growth surface of the single crystal was within 10 mm. The single crystal growth process was finished when the length of the SiC single crystal ingot reached about 20 mm. In order to adjust the generation and the distribution of non-MP defects in the SiC single crystal ingot, as a temperature lowering process, the cooling from a growth temperature of over 2000° C. to room temperature (about 25° C.) was controlled so that the cooling rate from the growth temperature to 1500° C. was 300° C./h and that from 1500° C. to room temperature was 300° C./h.

The resulting SiC single-crystal ingot was 208 mm in diameter and 20.2 mm in height.

Then, the SiC single-crystal ingot was fabricated by a known processing method to obtain twelve SiC substrates with 8-inch diameter having a surface with an off angle of 4° with respect to the (0001) plane, as a main surface, and a thickness of 1.0 mm.

The thickness of the SiC single crystal substrate was measured.

Then, the SiC single crystal substrate whose thickness was measured was placed on the carrier plate of the polishing device and lapped. The lapping slurry was obtained by adding a predetermined amount of boron carbide abrasive grains and AD8 (10 vol %) as an additive to water and dispersing. The grain size F 320 (JIS R 6001) was used as the boron carbide abrasive grain. Here, the proportion of glycerin (made by Aichemitechno Co., Ltd.) as an additive in the slurry was set at 6 vol %.

The lapping process was performed by the free abrasive grain method while the lapping slurry was supplied at a rare of 16 L/min. The lapping slurry was cycled and used.

The driving conditions of the polishing device in the lapping process were as follows: processing pressure 160 g/cm$^2$, lower surface speed 16 rpm, upper surface speed 5.5 rpm, center gear speed 2.8 rpm, internal gear speed 6.0 rpm, and processing time 40 minutes.

After lapping, the particle size distribution of the boron carbide abrasive grains in the slurry was measured in the same manner as before lapping, and the thickness of the substrate was measured in the same manner as before lapping, and the processing speed was calculated. In this lapping process, the average processing speed of 15 SiC substrates was 18 μm/h.

After the measurements were made, the slurry used in the previous lapping process was fed and a second lapping process and measurements were performed while circulating the slurry. In Example 1, this was repeated and a total of eight lapping and measurements were performed.

Then, an etching process for removing the work-affected layer and a CMP process for mirror-polishing were performed to obtain the SiC single crystal substrate of Example 1.

Example 2

The SiC single crystal substrate was obtained under the same conditions as in Example 1 except that the cooling rate from the growth temperature to 1500° C. was changed to 200° C./h in the cooling condition in the temperature lowering process.

Example 3

The SiC single crystal substrate was obtained under the same conditions as in Example 1 except that the cooling rate from the growth temperature to 1500° C. was changed to 100° C./h in the cooling condition in the temperature lowering process.

Example 4

The SiC single crystal substrate was obtained under the same conditions as in Example 1 except that the cooling rate from the growth temperature to 1500° C. was changed to 100° C./h and the cooling rate from 1500° C. to room temperature was changed to 200° C./h in the cooling condition in the temperature lowering process.

Example 5

The SiC single crystal substrate was obtained under the same conditions as in Example 2 except that a 150 mm diameter seed crystal S was used.

Comparative Example 1

The SiC single crystal substrate was obtained under the same conditions as in Example 1 except that the cooling rate from the growth temperature to 1500° C. was changed to 330° C./h in the cooling condition in the temperature lowering process.

Comparative Example 2

The SiC single crystal substrate was obtained under the same conditions as in Example 1 except that the cooling rate from the growth temperature to 1500° C. was changed to 40° C./h in the cooling condition in the temperature lowering process.

Comparative Example 3

The SiC single crystal substrate was obtained under the same conditions as in Example 1 except that the cooling rate from the growth temperature to 1500° C. was changed to 40° C./h and the cooling rate from 1500° C. to room temperature was changed to 50° C./h in the cooling condition in the temperature lowering process.

Evaluation

The non-MP defect pit density and SORI were measured for the SiC single crystal substrates of Example 1 to Example 5 and Comparative Example 1 to Comparative Example 3. Then, nitrogen ions were implanted into the surface by dopant using an ion implantation device, and the annealing process, which is usually performed with ion implantation during device fabrication, was performed in vacuum at 1600° C. for 30 minutes, and then the SORI of the SiC single crystal substrate was measured. The non-MP defect pit densities were measured by etch pits appearing by KOH etching at 550° C. for 10 minutes. Table 1 shows the results. The rate of change in SORI before and after ion implantation was calculated by the formula: (SORI before implantation−SORI after implantation)/(SORI before implantation)×100.

TABLE 1

|  | Non-MP defect density [/cm$^2$] | SORI before ion implantation [μm] | SORI after ion implantation [μm] | Change rate of SORI before and after ion implantation[%] |
|---|---|---|---|---|
| Comparative Example 1 | 0 | 11 | 174 | 15852 |
| Example 1 | 0.01 | 19 | 95 | 500 |
| Example 2 | 1.5 | 21 | 68 | 324 |
| Example 3 | 9.8 | 23 | 87 | 378 |
| Example 4 | 50.2 | 30 | 149 | 497 |
| Example 5 | 0.9 | 7 | 12 | 171 |
| Comparative Example 2 | 62.1 | 10 | 188 | 1880 |
| Comparative Example 3 | 108 | 23 | 192 | 835 |

Example 6 to Example 10, Comparative Example 4 to Comparative Example 7

A SiC single-crystal substrate was obtained in the same manner as Example 1, and the density distribution of non-MP etch pits in the central region of the SiC single crystal substrate and the outer region located around it was adjusted by annealing to obtain SiC single crystal substrates for evaluation of Example 6 to Example 9 and Comparative Example 4 to Comparative Example 7. The SiC single crystal substrate for the evaluation of Example 10 was obtained in the same manner as Example 6 to Example 9 and Comparative Example 4 to Comparative Example 7 except that the SiC single crystal substrate was obtained in the same manner as Example 5. The density of non-MP defect pits and SORT in the central and outer regions were measured on the resulting SiC single crystal substrate. The results are shown in Table 2.

before and after ion implantation exceeded 1500%. When the non-MP defect density exceeded 50/cm$^2$ (Comparative examples 2, 3), the change rate of SORI before and after ion implantation greatly exceeded 500%.

When the non-MP defect density was 1.5/cm$^2$ to 9.8/cm$^2$, the change rate of SORI before and after ion implantation was less than 400%. The smallest change in SORI before and after ion implantation was 324% when the non-MP defect density was 1.5/cm$^2$.

The presence of non-MP defects was also confirmed in Example 5, which was a 6-inch SiC single crystal substrate, as in Example 1 to Example 4, which was an 8-inch SiC single crystal substrate.

From the results of Example 6 to Example 9 and Comparative Example 4 to Comparative Example 5 shown in Table 2, it was found that the ratio NP of the density of non-MP defect pits in the central and outer regions can be adjusted by performing the substrate annealing process after obtaining the SiC single crystal substrate.

When the NP was 0.051 to 0.469 (Example 6 to Example 9), the change rate of SORI before and after ion implantation was 750% or less. In contrast, when the NP was 0.005 (Comparative Example 4), the rate of change in SORI before and after ion implantation was over 1600%, and when the NP was over 0.5 (Comparative Example 5 to Comparative Example 7), the rate of change in SORI before and after ion implantation was nearly 1000%, and when the NP was 0.694, the rate of change in SORI before and after ion implantation was over 3000%.

When the NP was 0.137 to 0.213 (Example 7~8) the change rate of SORI before and after ion implantation was about 300% or less. The smallest change in SORI before and after ion implantation was 210% when the NP was 0.213 (Example 8).

It was also found that the ratio NP of the density of non-MP defect pits in the central and outer regions could be adjusted for Example 10, which was a 6-inch SiC single-

TABLE 2

|  | Non-MP defect density[/cm$^2$] | | | SORI[μm] | | Change rate of SORI |
|---|---|---|---|---|---|---|
|  | NA | NB | NP | before ion implantation | after ion implantation | before and after ion implantation[%] |
| Comparative Example 4 | 0.032 | 6.29 | 0.005 | 10 | 162 | 1620 |
| Example 6 | 6.23 | 117 | 0.051 | 12 | 90 | 750 |
| Example 7 | 0.051 | 0.322 | 0.137 | 18 | 57 | 317 |
| Example 8 | 11.6 | 42.9 | 0.213 | 20 | 42 | 210 |
| Example 9 | 106 | 120 | 0.469 | 15 | 103 | 687 |
| Example 10 | 0.3 | 1.1 | 0.214 | 7 | 12 | 171 |
| Comparative Example 5 | 4.68 | 4.55 | 0.507 | 25 | 243 | 972 |
| Comparative Example 6 | 48.7 | 32.1 | 0.603 | 16 | 323 | 2013 |
| Comparative Example 7 | 0.25 | 0.11 | 0.694 | 9 | 271 | 3011 |

From the results of Example 1 to Example 4 shown in Table 1, it was found that the non-MP defect density could be adjusted by the cooling rate in the cooling process after crystal growth. It was found that the smaller the cooling rate, the larger the non-MP defect density in the range of cooling rates of the examples.

In addition, when the non-MP defect density was 0.01/cm$^2$ to 50.2/cm$^2$ (Example 1 to Example 4), the change rate of SORI before and after ion implantation was less than 500%. In contrast, when the non-MP defect density was 0/cm$^2$ (Comparative Example 1), the change rate of SORI crystal substrate, as in Example 6 to Example 9, which was an 8-inch SiC single-crystal substrate.

EXPLANATION OF REFERENCES

1 SiC single crystal substrate
1A central region
1B outer region

What is claimed is:
1. A SiC single crystal substrate, wherein a main plane of the SiC single crystal substrate has an off angle of 0° to 6° to the (0001) plane in the <11-20> direction and an off angle of 0° to 0.5° to the (0001) plane in the <1-100> direction, and includes non-MP defects wherein when a Si surface is etched in molten KOH at 500° C. for 15 minutes, the non-MP defects that appear by etching are hexagonal and have no core, an area of an observed etch pit of a non-MP defect is more than 10% larger than that of an observed etch pit of a threading screw dislocation (TSD) and is less than 110% of that of an observed etch pit of a micropipe (MP), and a transmission X-ray topography image of the non-MP defect is distinguishable from a transmission X-ray topography image of the micropipe (MP), wherein when the substrate is divided into a central region within the range of r/2 (where r is the radius of the substrate) from the center of the substrate and an outer region located outside the central region, the density (NA) of etch pits, which are identified as the non-MP defects in the central region, and the density (NB) of etch pits, which are identified as the non-MP defects in the outer region, satisfy the following relationship:

$0.01 < NP < 0.5$ (where $NP = \{NA/(NA+NB)\}$).

2. The SiC single crystal substrate according to claim 1, wherein the density of etch pits, which are identified as the non-MP defects, is in a range of $0.1/cm^2$ to $50/cm^2$.

3. The SiC single crystal substrate according to claim 2, wherein the density of etch pits, which are identified as the non-MP defects, is in a range of $0.9/cm^2$ to $50/cm^2$.

4. The SiC single crystal substrate according to claim 3, wherein the diameter of the SiC single crystal substrate is in a range of 145 mm to 155 mm.

5. The SiC single crystal substrate according to claim 3, wherein the diameter of the SiC single crystal substrate is in a range of 190 mm to 205 mm.

6. The SiC single crystal substrate according to claim 2, wherein the diameter of the SiC single crystal substrate is in a range of 145 mm to 155 mm.

7. The SiC single crystal substrate according to claim 2, wherein the diameter of the SiC single crystal substrate is in a range of 190 mm to 205 mm.

8. A SiC single crystal substrate, wherein the main plane of the SiC single crystal substrate has an off angle of 0° to 6° to the (0001) plane in the <11-20> direction and an off angle of 0° to 0.5° to the (0001) plane in the <1-100> direction, and includes non-MP defects wherein when the Si surface is etched in molten KOH at 500° C. for 15 minutes, the non-MP defects that appear by etching are hexagonal and have no core, the area of an observed etch pit of the non-MP defect is more than 10% larger than that of an observed etch pit of a threading screw dislocation (TSD) and is less than 110% of that of an observed etch pit of the micropipe (MP), and a transmission X-ray topography image of the non-MP defect is distinguishable from the transmission X-ray topography image of the micropipe (MP), wherein a density of the etch pits, which are identified as the non-MP defects, is in a range of $0.01/cm^2$ to $50/cm^2$, and wherein when the substrate is divided into a central region within the range of r/2 (where r is the radius of the substrate) from the center of the substrate and an outer region located outside the central region, the density (NA) of etch pits, which are identified as the non-MP defects in the central region, and the density (NB) of etch pits, which are identified as the non-MP defects in the outer region, satisfy the following relationship:

$0.01 < NP < 0.5$ (where $NP = \{NA/(NA+NB)\}$).

* * * * *